(12) United States Patent
Loginov et al.

(10) Patent No.: US 10,328,739 B2
(45) Date of Patent: Jun. 25, 2019

(54) PROCESSES FOR PRODUCING OPTICAL EFFECTS LAYERS

(71) Applicant: SICPA HOLDING SA, Prilly (CH)

(72) Inventors: Evgeny Loginov, Renens (CH);
Mathieu Schmid, Lausanne (CH);
Claude-Alain Despland, Prilly (CH);
Pierre Degott, Crissier (CH)

(73) Assignee: SICPA HOLDING SA, Prilly (CH)

( * ) Notice: Subject to any disclaimer, the term of this patent is extended or adjusted under 35 U.S.C. 154(b) by 4 days.

(21) Appl. No.: 15/572,386

(22) PCT Filed: May 31, 2016

(86) PCT No.: PCT/EP2016/062245
§ 371 (c)(1),
(2) Date: Nov. 7, 2017

(87) PCT Pub. No.: WO2016/193252
PCT Pub. Date: Dec. 8, 2016

(65) Prior Publication Data
US 2018/0111406 A1  Apr. 26, 2018

(30) Foreign Application Priority Data

Jun. 2, 2015 (EP) .................................... 15170246

(51) Int. Cl.
*B42D 25/369* (2014.01)
*B41M 3/14* (2006.01)
(Continued)

(52) U.S. Cl.
CPC .......... *B42D 25/369* (2014.10); *B41M 3/148* (2013.01); *B42D 25/29* (2014.10); *B42D 25/364* (2014.10);
(Continued)

(58) Field of Classification Search
None
See application file for complete search history.

(56) References Cited

U.S. PATENT DOCUMENTS 2,570,856 A   10/1951 Pratt et al.
2,829,862 A   4/1958  Wey
(Continued)

FOREIGN PATENT DOCUMENTS

EP   0119425   1/1990
EP   0717313   6/1996
(Continued)

OTHER PUBLICATIONS

International Search Report and Written Opinion issued with respect to application No. PCT/EP2016/062245.
(Continued)

*Primary Examiner* — Shamim Ahmed
*Assistant Examiner* — Bradford M Gates
(74) *Attorney, Agent, or Firm* — Muncy, Geissler, Olds & Lowe, P.C.

(57) ABSTRACT

The invention relates to the field of the protection of security documents such as for example banknotes and identity documents against counterfeit and illegal reproduction. In particular, the invention relates to processes for producing optical effect layers (OELs) comprising a motif made of at least two areas made of a single hardened layer on a substrate comprising a photomask.

18 Claims, 14 Drawing Sheets

(51) Int. Cl.

| | | |
|---|---|---|
| G03F 7/00 | (2006.01) | |
| G03F 7/105 | (2006.01) | |
| G03F 7/20 | (2006.01) | |
| G07D 7/00 | (2016.01) | |
| B42D 25/29 | (2014.01) | |
| B42D 25/364 | (2014.01) | |
| B42D 25/387 | (2014.01) | |
| B42D 25/415 | (2014.01) | |
| G03F 7/031 | (2006.01) | |
| B42D 25/42 | (2014.01) | |
| H01F 41/16 | (2006.01) | |
| B42D 25/324 | (2014.01) | |
| B42D 25/425 | (2014.01) | |
| G06Q 30/00 | (2012.01) | |

(52) U.S. Cl.
CPC ......... *B42D 25/387* (2014.10); *B42D 25/415* (2014.10); *B42D 25/42* (2014.10); *G03F 7/001* (2013.01); *G03F 7/031* (2013.01); *G03F 7/105* (2013.01); *G03F 7/2012* (2013.01); *G03F 7/2022* (2013.01); *G07D 7/003* (2017.05); *H01F 41/16* (2013.01); *B42D 25/324* (2014.10); *B42D 25/425* (2014.10); *G03F 7/0012* (2013.01); *G06Q 30/0185* (2013.01)

(56) References Cited

U.S. PATENT DOCUMENTS

| | | | |
|---|---|---|---|
| 3,676,273 | A | 7/1972 | Graves |
| 3,791,864 | A | 2/1974 | Steingroever |
| 4,838,648 | A | 6/1989 | Phillips et al. |
| 5,074,914 | A | 12/1991 | Shirota et al. |
| 5,354,794 | A | 10/1994 | Stevenson et al. |
| 5,364,689 | A | 11/1994 | Kashiwagi et al. |
| 5,476,937 | A | 12/1995 | Stevenson et al. |
| 5,556,973 | A | 9/1996 | Stevenson et al. |
| 5,630,877 | A | 5/1997 | Kashiwagi et al. |
| 5,997,622 | A | 12/1999 | Weber et al. |
| 6,001,161 | A | 12/1999 | Evans et al. |
| 6,410,130 | B1 | 6/2002 | Schuhmacher et al. |
| 6,531,221 | B1 | 3/2003 | Schuhmacher et al. |
| 6,582,781 | B1 | 6/2003 | Schuhmacher et al. |
| 6,838,166 | B2 | 1/2005 | Phillips et al. |
| 7,047,888 | B2 | 5/2006 | Richards |
| 7,517,578 | B2 | 4/2009 | Raksha et al. |
| 8,025,952 | B2 | 9/2011 | Raksha et al. |
| 8,343,615 | B2 | 1/2013 | Raksha et al. |
| 8,546,484 | B2 | 10/2013 | Higuchi et al. |
| 2003/0165637 | A1* | 9/2003 | Phillips ............ B05D 3/20 427/598 |
| 2005/0106367 | A1 | 5/2005 | Raksha et al. |
| 2008/0031832 | A1 | 2/2008 | Wakefield et al. |
| 2011/0245392 | A1 | 10/2011 | Karpov et al. |
| 2013/0084411 | A1 | 4/2013 | Raksha et al. |
| 2013/0229824 | A1 | 9/2013 | Jeoung et al. |
| 2016/0075166 | A1* | 3/2016 | Ritter ............ D21H 21/48 283/107 |
| 2017/0253070 | A1* | 9/2017 | Loginov ............ B05D 3/207 |

FOREIGN PATENT DOCUMENTS

| | | |
|---|---|---|
| EP | 0686675 | 2/1998 |
| EP | 1666546 | 6/2006 |
| EP | 1710756 | 10/2006 |
| EP | 1819525 | 3/2010 |
| EP | 2032577 | 2/2011 |
| EP | 1844049 | 3/2011 |
| EP | 2306222 | 4/2011 |
| EP | 2325677 | 5/2011 |
| EP | 2402401 | 1/2012 |
| EP | 2433798 | 3/2012 |
| EP | 2125713 | 4/2012 |
| EP | 1620500 | 7/2012 |
| EP | 2484455 | 8/2012 |
| EP | 1888539 | 9/2013 |
| JP | 62-190272 | 8/1987 |
| JP | 63-218766 | 9/1988 |
| JP | 02-080470 | 3/1990 |
| WO | 2002028854 | 4/2002 |
| WO | 2002073250 | 9/2002 |
| WO | 2002090002 | 11/2002 |
| WO | 2003000801 | 1/2003 |
| WO | 2004099302 | 11/2004 |
| WO | 2005002866 | 1/2005 |
| WO | 2006063926 | 6/2006 |
| WO | 2006131466 | 12/2006 |
| WO | 2007131833 | 11/2007 |
| WO | 2008000646 | 1/2008 |
| WO | 2008046702 | 4/2008 |
| WO | 2008049755 | 5/2008 |
| WO | 2011092502 | 8/2011 |
| WO | 2012038531 | 3/2012 |
| WO | 2012104098 | 8/2012 |
| WO | 2014108303 | 7/2014 |
| WO | 2014108404 | 7/2014 |

OTHER PUBLICATIONS

*The Printing Ink Manual*, R.H. Leach and R.J. Pierce, Springer Edition, 5th Edition, 2008, pp. 58-62.
*Printing Technology*, J.M. Adams and P.A. Dolin, Delmar Thomson Learning, 5th Edition, 2002, pp. 293-328.
*Handbook of Print Media*, Helmut Kipphan, Springer Edition, 2001, p. 48.
*The Printing Ink Manual*, R.H. Leach and R.J. Pierce, Springer Edition, 5th Edition, 2008, pp. 42-51.
*Printing Technology*, J. M. Adams and P.A. Dolin, Delmar Thomson Learning, 5th Edition, 2002, pp. 359-360.
*The Printing Ink Manual*, R.H. Leach and R.J. Pierce, Springer Edition, 5th Edition, 2008, pp. 33-42.
*Chemistry & Technology of UV & EB Formulation for Coatings, Inks & Paints*, published in 7 Volumes in 1997-1998 by John Wiley & Sons in association with SITA Technology Limited, 4 pages.
*Chemistry & Technology of UV & EB Formulation for Coatings, Inks & Paint*, vol. III, "Photoinitiators for Free Radical Cationic and Anionic Polymerization", 2nd edition, by J. V. Crivello & K. Dietliker, edited by G. Bradley, John Wiley & Sons in association with SITA Technology Limited, 4 pages.
*The Printing Ink Manual*, R.H. Leach and R.J. Pierce, Springer Edition, 5th Edition, 2008, p. 74.
*Optical Document Security*, R. L. van Renesse, 2005, 3rd Edition, pp. 115-117.

* cited by examiner

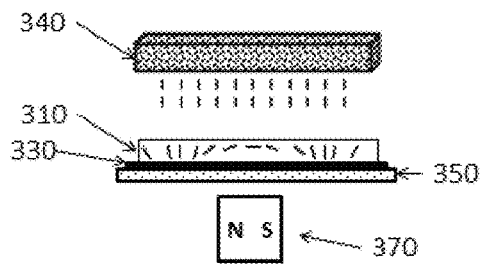
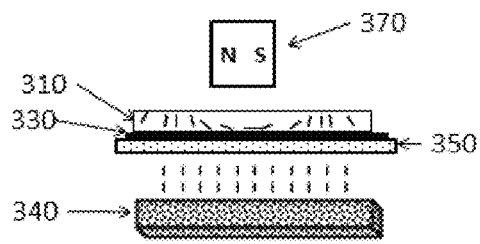
Fig. 3A            Fig. 3B
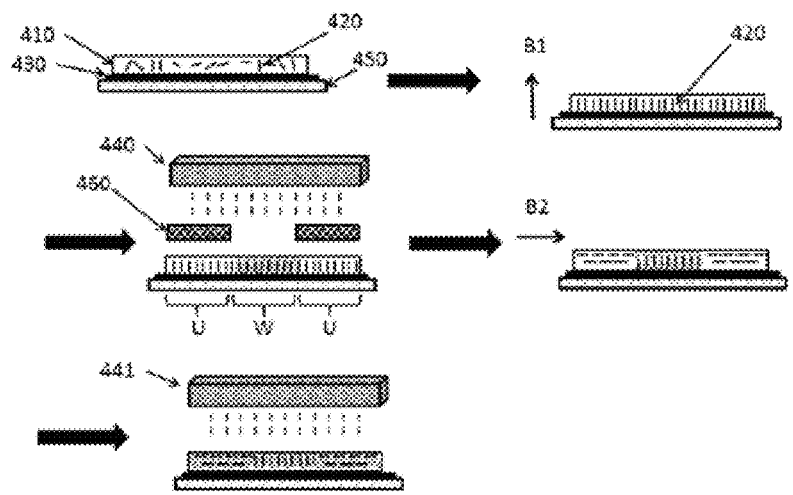
Fig. 4

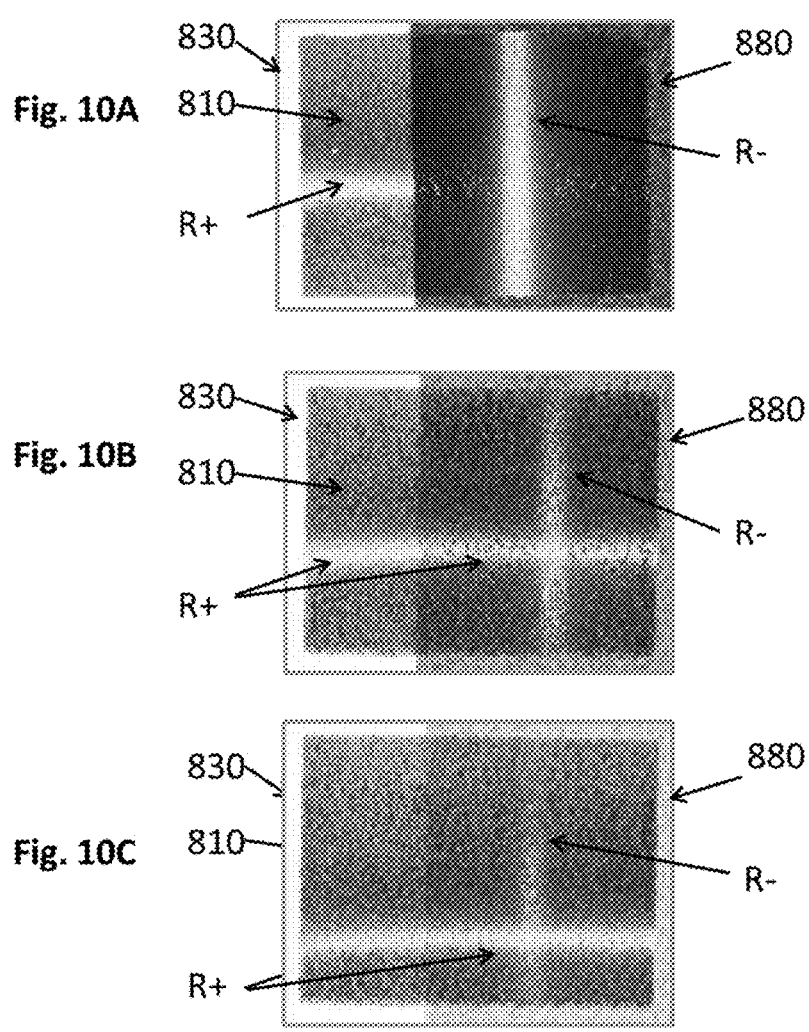

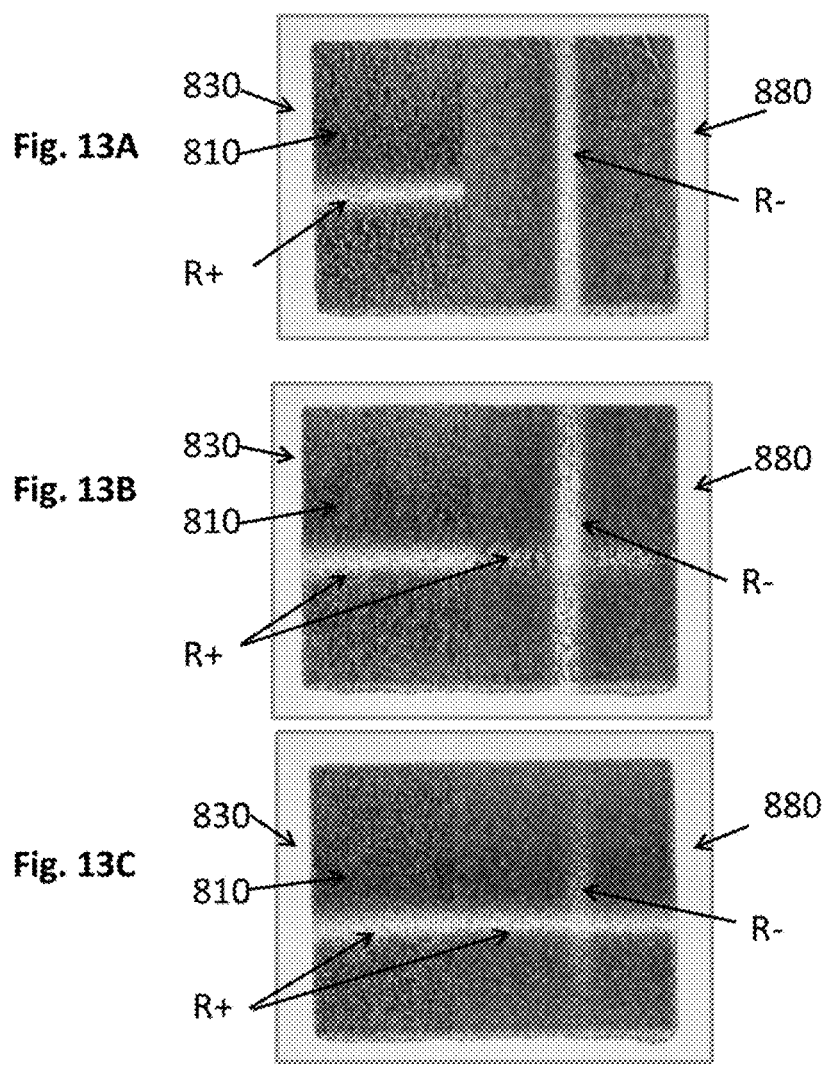

PROCESSES FOR PRODUCING OPTICAL EFFECTS LAYERS

FIELD OF THE INVENTION

The present invention relates to the field of the protection of value documents and value commercial goods against counterfeit and illegal reproduction. In particular, the present invention relates to processes for producing optical effect layers (OEL) comprising magnetically oriented magnetic or magnetizable pigment particles.

BACKGROUND OF THE INVENTION

It is known in the art to use inks, compositions or layers containing magnetic or magnetizable particles or pigments, particularly also magnetic optically variable pigments, for the production of security elements, e.g. in the field of security documents. Coatings or layers comprising oriented magnetic or magnetizable particles are disclosed for example in U.S. Pat. Nos. 2,570,856; 3,676,273; 3,791,864; 5,630,877 and 5,364,689. Coatings or layers comprising oriented magnetic color-shifting pigment particles, resulting in particularly appealing optical effects, useful for the protection of security documents, have been disclosed in WO 2002/090002 A2 and WO 2005/002866 A1.

Security features, e.g. for security documents, can generally be classified into "covert" security features one the one hand, and "overt" security features on the other hand. The protection provided by covert security features relies on the concept that such features are difficult to detect, typically requiring specialized equipment and knowledge for detection, whereas "overt" security features rely on the concept of being easily detectable with the unaided human senses, e.g. such features may be visible and/or detectable via the tactile senses while still being difficult to produce and/or to copy. However, the effectiveness of overt security features depends to a great extent on their easy recognition as a security feature, because most users, and particularly those having no prior knowledge of the security features of a therewith secured document or item, will only then actually perform a security check based on said security feature if they have actual knowledge of their existence and nature.

A particularly striking optical effect can be achieved if a security feature changes its appearance in view to a change in viewing conditions, such as the viewing angle. Such an effect can e.g. by obtained by dynamic appearance-changing optical devices (DACODs), such as concave, respectively convex Fresnel type reflecting surfaces relying on oriented pigment particles in a hardened coating layer, as disclosed in EP 1 710 756 A1. This document describes one way to obtain a printed image that contains pigment particles or flakes having magnetic properties by aligning the pigment particles in a magnetic field. The pigment particles or flakes, after their alignment in a magnetic field, show a Fresnel structure arrangement, such as a Fresnel reflector. By tilting the image and thereby changing the direction of reflection towards a viewer, the area showing the greatest reflection to the viewer moves according to the alignment of the flakes or pigment particles (FIG. 1).

While the Fresnel type reflecting surfaces are flat, they can be made to provide the appearance of a concave or convex reflecting curved surface such as e.g. a cylinder or a hemisphere. Said Fresnel type reflecting surfaces can be produced by exposing a wet coating layer comprising non-isotropically reflecting magnetic or magnetizable pigment particles to the magnetic field of a single dipole magnet, wherein the latter is disposed above for concave effect (FIGS. 2B and 2C bottom), respectively below the plane of the coating layer for convex effect (FIGS. 2A and 2C top), as illustrated in FIG. 7B of EP 1 710 756 A1 for a convex orientation. The so-oriented pigment particles are consequently fixed/frozen in position and orientation by hardening the coating layer.

One example of such a structure is the so-called "rolling bar" effect, as disclosed in US 2005/0106367. A "rolling bar" effect is based on pigment particles orientation imitating a curved surface across the coating. The observer sees a specular reflection zone which moves away or towards the observer as the image is tilted. A so-called positive rolling bar comprises pigment particles oriented in a concave fashion (FIG. 2B) and follows a positively curved surface; a positive rolling bar moves with the rotation sense of tilting. A so-called negative rolling bar comprises pigment particles oriented in a convex fashion (FIGS. 1 and 2A) and follows a negatively curved surface; a negative rolling bar moves against the rotation sense of tilting. A hardened coating comprising pigment particles having an orientation following a concave curvature (positive curve orientation), shows a visual effect characterized by an upward movement of the rolling bar (positive rolling bar) when the support is tilted backwards. The concave curvature refers to the curvature as seen by an observer viewing the hardened coating from the side of the support carrying the hardened coating (FIG. 2B). A hardened coating comprising pigment particles having an orientation following a convex curvature (negative curve orientation, FIG. 2A) shows a visual effect characterized by a downward movement of the rolling bar (negative rolling bar) when the support carrying the hardened coating is tilted backwards (i.e. the top of the support moves away from the observer while the bottom of the support moves towards from the observer) (FIG. 1). This effect is nowadays utilized for a number of security elements on banknotes, such as on the "5" and the"10" of the 5 respectively 10 Euro banknote or the "100" of the 100 Rand banknote of South Africa.

For optical effect layers printed on a substrate, negative rolling bar effect (orientation of the pigment particles (220) in a convex fashion, curve of FIG. 2A) are produced by exposing a wet coating layer to the magnetic field of a magnet disposed on the opposite side of the substrate to the coating layer (FIG. 2C top), while positive rolling bar effect (orientation of the pigment particles (220) in a concave fashion, curve of FIG. 2B) are produced by exposing a wet coating layer to the magnetic field of a magnet disposed on the same side of the substrate as the coating layer (FIG. 2C bottom). Examples of positive and negative rolling bar effect and combinations thereof have been disclosed in US 2005/0106367 and in WO 2012/104098 A1. For positive rolling bar, the position of the magnet facing the still wet coating layer prevents the simultaneous curing of the coating layer with a UV irradiation source facing the coating layer.

U.S. Pat. No. 2,829,862 teaches the importance of the viscoelastic properties of the carrier material for preventing reorientation of the magnetic particles after the removal of the external magnet. Keeping the coating composition comprising the magnetic or magnetizable pigment particles or flakes within the magnetic field during the hardening process can preserve the orientation of the magnetic or magnetizable pigment particles or flakes Examples of such processes (as illustrated FIG. 3A) are disclosed for example in WO 2012/038531, EP 2433798 A1 or in US 2005/0106367A1. In all these examples, the external magnetic device is located on the side of the substrate opposite to the side carrying the coating composition and the hardening process is triggered by an irradiation source positioned on the side of the substrate carrying the coating composition.

The co-pending application EP 14178901.6 discloses a method for producing image coated articles by using magnetic pigments. The method comprises the steps of i) applying to a substrate a coating composition comprising a plurality of magnetic or magnetizable pigment particles, ii) exposing the coating layer to the magnetic field of a magnetic-field-generating device and iii) simultaneously or partially simultaneously hardening the coating layer through the substrate the coating layer the with a UV-Vis radiation source. The magnetic-field-generating device disclosed in EP 14178901.6 is located on the side of the substrate carrying the coating layer and the hardening process is triggered by UV-Vis radiation source positioned on the side of the substrate opposite to the side carrying the coating, i.e. hardening is carried out through the substrate.

WO 02/090002 A2 discloses a method for producing images on coated articles. The method (as illustrated in FIG. 4) comprises the steps of i) applying a layer of magnetizable pigment coating in liquid form on a substrate, with the magnetizable pigment coating containing a plurality of magnetic non-spherical particles or flakes, ii) exposing the pigment coating to a magnetic field and iii) solidifying the pigment coating by exposure to electromagnetic radiation. During the solidifying step, an external photomask with voids may be positioned between the pigment coating and the electromagnetic radiation source. The photomask disclosed in WO 02/090002 A2, allows to solidify only the exposed regions of the pigment coating facing the voids of the photomask thereby allowing the orientation of the flakes to be fixed/frozen only in those regions. The flakes dispersed in the un-exposed parts of the pigment coating may be re-oriented, in a subsequent step, using a second magnetic field. The pattern formed by the selective solidifying with a photomask allows for a higher resolution imaging than can be obtained by use of patterned magnetic fields or for patterns that cannot be achieved with simple magnetic fields. In this process, it is mandatory to keep the relative position of the coated substrate and the photomask constant during the solidifying step. As a consequence, the coated substrate may not be moved in a continuous translation movement in front of a fixed photomask and electromagnetic radiation source.

Therefore there is a need for a process for producing optical effect layers involving a photomask that would move in an absolutely concomitant mode as the applied coating comprising magnetic or magnetizable pigment particles. In particular, there is a need for producing optical effect layers comprising a motif made of at least two areas having different magnetic or magnetizable pigment particles orientation patterns in an efficient manner, with a high resolution and exact register.

SUMMARY OF THE INVENTION

Accordingly, it is an object of the present invention to overcome the deficiencies of the prior art as discussed above.

In a first aspect, the present invention provides a process for producing an optical effect layer (OEL) on a substrate comprising a photomask, said OEL comprising a motif made of at least two areas, preferably at least two adjacent areas, made of a single hardened layer, said process comprising the steps of:
   a) applying on the substrate comprising the photomask a radiation curable coating composition comprising one or more photoinitiators and a plurality of magnetic or magnetizable pigment particles so as to form a coating layer, said coating layer being in a first state and said coating layer at least partially facing the photomask;
   b)
   b1) hardening one or more first substrate areas carrying the coating layer through the substrate, said hardening being performed by irradiation with a UV-Vis irradiation source to a second state so as to fix or freeze the magnetic or magnetizable pigment particles in their positions and orientations; and
   c)
   c1) exposing at least one or more second substrate areas carrying the coating layer which are in a first state due to the presence of the photomask of the substrate to the magnetic field of a magnetic-field-generating device thereby orienting the plurality of magnetic or magnetizable pigment particles so as to follow any magnetic or magnetizable pigment particles orientation pattern except a random orientation; and
   c2) simultaneously, partially simultaneously or subsequently hardening by irradiation with a UV-Vis irradiation source at least the one or more second substrate areas carrying the coating layer to a second state so as to fix or freeze the magnetic or magnetizable pigment particles in their adopted positions and orientations.

In an embodiment that may be optionally included, the photomask has an optical density DM equal to or higher than 1.0, preferably equal to or higher than 1.1 and more preferable equal to or higher than 1.2.

In another embodiment, the UV-Vis radiation source of step c2) is located on the side of the substrate carrying the coating layer.

In a further aspect of the present invention, an optical effect layer (OEL) is provided that is prepared by the process recited above.

In a further aspect, a use of the optical effect layer (OEL) is provided for the protection of a security document against counterfeiting or fraud or for a decorative application.

In a further aspect, a security document comprising one or more optical effect layers (OEL) as recited above is provided.

In a further aspect, an optical effect layer (OEL) is provided, wherein the OEL is disposed on a substrate comprising a photomask, said OEL comprising a motif made of at least two areas, preferably at least two adjacent areas, made of a single hardened layer, the OEL comprising a radiation cured coating composition comprising a plurality of magnetic or magnetizable pigment particles fixed or frozen in the coating composition by radiation curing so as to form a coating layer, said coating layer at least partly overlapping with the photomask to provide a masked area and an unmasked area thereof;
   wherein the magnetic or magnetizable pigment particles of the masked area of the coating layer are oriented so as to follow any magnetic or magnetizable pigment particles orientation pattern except a random orientation; and
   wherein the magnetic or magnetizable pigment particles of the unmasked area of the coating layer follow a random pattern or are oriented so as to follow a different orientation pattern than the magnetic or magnetizable pigment particles of the unmasked area to provide visually distinct optical impressions as determinable by the human eye.

In an embodiment, the magnetic or magnetizable pigment particles in the masked area are oriented so as to follow one of a concave or convex curvature when viewed from the side carrying the coating layer and the magnetic or magnetizable pigment particles in the unmasked area are oriented so as to follow the other of a concave or convex curvature when viewed from the side carrying the coating layer.

In an embodiment, the photomask is printed on the substrate.

In an embodiment, the photomask is disposed on a side of the substrate facing away from the coating layer or the photomask is disposed on the side of the substrate carrying the coating layer and is disposed intermediate the coating layer and the substrate.

In an embodiment, the photomask is made of a UV absorbing photomask composition.

BRIEF DESCRIPTION OF DRAWINGS

FIG. 3A-B schematically illustrate examples of processes using a magnetic-field generating device and an irradiation source suitable for a simultaneous or a partially simultaneous hardening of a coating layer comprising magnetic or magnetizable pigment particles for producing an optical effect layer following a negatively curved magnetic field line in a convex fashion (FIG. 3A) according to the Prior Art, or following a positively curved magnetic field line in a concave fashion (FIG. 3B) (co-pending application EP 14178901.6).

FIG. 4 illustrates an example of a process for producing an optical effect layer using a first magnetic device generating a first magnetic field B1, an irradiation source (440) equipped with a photomask (460), a second magnetic device generating a second magnetic field B2 and an irradiation source (441) according to the Prior Art.

FIG. 8D-1, 8D-2 schematically illustrates an OEL obtained after the second step of the process of FIG. 8B. FIG. 8D-2 is obtained by a 90° rotation of FIG. 8D-1 in the plane of the substrate (830).

FIG. 10A-C, 11A-C, 12A-C show pictures of OEL's prepared according to the process illustrated in FIGS. 8A and 8B, wherein the photomask is a solvent-based silkscreen printed UV-absorbing photomask comprising various UV-absorbing materials.

FIG. 13A-C show pictures of OEL's prepared according to the process illustrated in FIGS. 8A and 8B, wherein the photomask is a UV curable silkscreen printed UV-absorbing photomask.

DETAILED DESCRIPTION

Definitions

Figure 1:
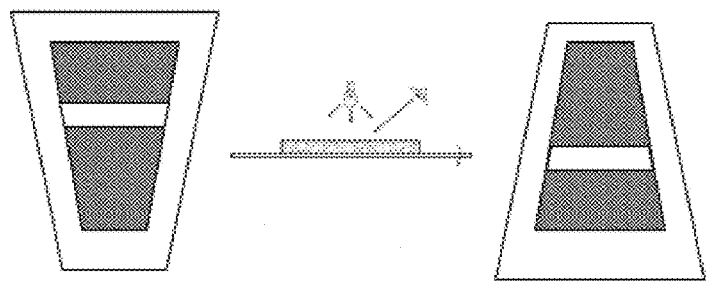
FIG. 1 schematically illustrates an optical "Rolling Bar" effect with a convex curvature (negative).

The following definitions are to be used to interpret the meaning of the terms discussed in the description and recited in the claims.

As used herein, the indefinite article "a" indicates one as well as more than one and does not necessarily limit its referent noun to the singular.

As used herein, the term "about" means that the amount or value in question may be the specific value designated or some other value in its neighborhood. Generally, the term "about" denoting a certain value is intended to denote a range within ±5% of the value. As one example, the phrase "about 100" denotes a range of 100±5, i.e. the range from 95 to 105. Generally, when the term "about" is used, it can be expected that similar results or effects according to the invention can be obtained within a range of ±5% of the indicated value.

As used herein, the term "and/or" means that either all or only one of the elements of said group may be present. For example, "A and/or B" shall mean "only A, or only B, or both A and B". In the case of "only A", the term also covers the possibility that B is absent, i.e. "only A, but not B".

The term "comprising" as used herein is intended to be non-exclusive and open-ended. Thus, for instance a composition comprising a compound A may include other compounds besides A. However, the term "comprising" also covers the more restrictive meanings of "consisting essentially of" and "consisting of", so that for instance "a composition comprising a compound A" may also (essentially) consist of the compound A.

The term "coating composition" refers to any composition which is capable of forming an optical effect layer (OEL) as used herein on a solid substrate and which can be applied preferentially but not exclusively by a printing method.

The term "coating layer" refers to any layer made of the coating composition described therein.

The term "harden" and "hardening" refers to processes including the curing, drying or solidifying, reacting or polymerization of an applied composition in such a manner that it produces an increase of the viscosity of a coating composition in reaction to a stimulus.

The term "hardened" is used to denote an increased viscosity of a coating composition in reaction to stimulus to convert a material into a state, i.e. a hardened or solid state where the magnetic or magnetizable pigment particles are fixed or frozen (fixed/frozen) in their current positions and orientations and can no longer move nor rotate.

The term "optical effect layer (OEL)" as used herein denotes a coating layer that comprises a plurality of oriented magnetic or magnetizable pigment particles and a binder, wherein the non-random orientation of the magnetic or magnetizable pigment particles is fixed/frozen within the binder.

The term "rolling bar" or "rolling bar effect" denotes an area within the OEL that provides the optical effect or optical impression of a cylindrical bar shape lying crosswise within the OEL, with the axis of the cylindrical bar lying parallel to the plane of the OEL and the part of the curved surface of the cylindrical bar being above the plane of the OEL. The "rolling bar", i.e. the cylindrical bar shape, can be symmetrical or non-symmetrical, i.e. the radius of the cylindrical bar may be constant or not constant; when the radius of the cylindrical bar is not constant, the rolling bar has a conical form.

Figure 2A:
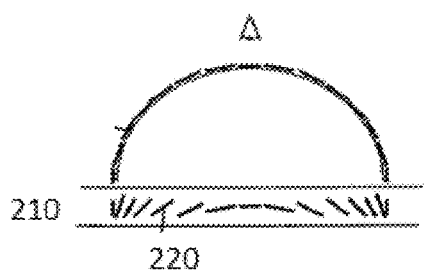
FIG. 2A-B schematically illustrates pigment particles following the tangent to a negatively curved magnetic field line in a convex fashion (2A) and the tangent to a positively curved magnetic field line in a concave fashion (2B).
Figure 2B:
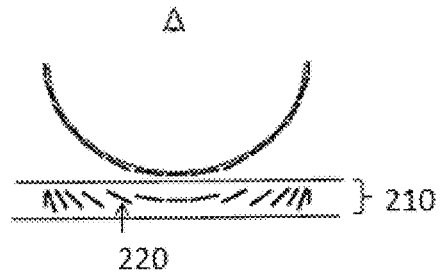
Figure 2C:
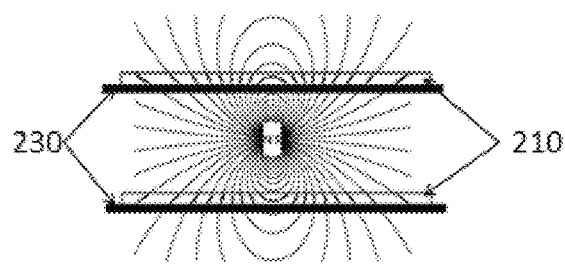
FIG. 2C schematically illustrates a magnetic-field generating device suitable for producing a magnetic field in a convex fashion (top) or a concave fashion (bottom) as a function of its position according to the prior art.

The terms "convex fashion" or "convex curvature" and the terms "concave fashion" or "concave curvature" refer to the curvature of the Fresnel surface across the OEL that provides the optical effect or the optical impression of a rolling bar. A Fresnel surface is an essentially flat or thin surface comprising structures in the form of a series of sections with changing slope angles which approximatively reproduce the curvature of a larger solid material, such as lense or mirror. At the position where the OEL is produced, the magnetic-field-generating device orients the magnetic or magnetizable pigment particles following the tangent to a curved surface. The terms "convex fashion" or "convex curvature" and the terms "concave fashion" or "concave curvature" refer to the apparent curvature of the curved surface as seen by an observer viewing the optical effect layer OEL from the side of the optical effect coated substrate (OEC) carrying the OEL. The curvature of the curved surface follows the magnetic field lines produced by the magnetic field-generating device at the position where the OEL is produced. A "convex curvature" refers to a negatively curved magnetic field line (as shown in FIG. 2A); a "concave curvature" refers to a positively curved magnetic field line (as shown in FIG. 2B).

The term "security element" is used to denote an image or graphic element that can be used for authentication purposes. The security element can be an overt and/or a covert security element.

DETAILED DESCRIPTION OF THE INVENTION

The present invention provides a process for producing an optical effect layer (OEL) on a substrate comprising a photomask, wherein the OEL comprises a motif made of at least two areas, preferably at least two adjacent areas, made of a single hardened layer and wherein the at least two areas have a different magnetic or magnetizable pigment particles orientation pattern. One area of the at least two areas comprises a plurality of magnetic or magnetizable pigment particles oriented so as to follow a first magnetic or magnetizable pigment particles orientation pattern, said orientation pattern may be a random orientation pattern or any orientation pattern except a random orientation pattern, preferably an orientation pattern wherein the plurality of magnetic or magnetizable pigment particles are oriented so as to follow a concave curvature when viewed from the side carrying the OEL; and another area of the at least two areas comprises a plurality of magnetic or magnetizable pigment oriented so as to follow any magnetic or magnetizable pigment particles orientation except a random orientation, preferably an orientation pattern wherein the plurality of magnetic or magnetizable pigment particles are oriented so as to follow a convex curvature when viewed from the side carrying the OEL, wherein the magnetic or magnetizable pigment particles orientation patterns of the at least two areas are distinguishable with the naked eye.

According to one embodiment, at least one of the at least two areas, preferably at least one of the at least two adjacent areas, described herein comprises a plurality of oriented magnetic or magnetizable pigment particles, wherein said plurality of magnetic or magnetizable pigment particles is oriented so as to follow a concave curvature when viewed from the side carrying the OEL, in particular wherein said plurality of magnetic or magnetizable pigment particles is oriented so that the OEL exhibit a positive rolling bar feature.

As described in the prior art, for example in U.S. Pat. No. 7,047,888, U.S. Pat. No. 7,517,578 and WO 2012/104098 A1 and as illustrated in FIGS. 1, 2A and 2C top, known methods to produce an orientation of magnetic or magnetizable pigment particles following a negative curve (convex curvature when viewed from the side carrying the coating layer (210), i.e. the applied radiation curable coating composition comprising the magnetic or magnetizable pigment particles (220), as illustrated by an eye in FIG. 2A) include the use of a magnetic-field generating device to orient the magnetic or magnetizable pigment particles (220), said device being placed underneath the substrate (230) (see FIG. 2C, top). To produce on a substrate (230) an orientation of magnetic or magnetizable pigment particles (220) following a positive curve (concave curvature when viewed from the side carrying the coating layer (210), as illustrated by an eye in FIG. 2B), the magnetic-field generating device used to orient the magnetic or magnetizable pigment particles (220) is placed above the substrate (FIG. 2C, below), i.e. the device faces the coating layer (210) comprising the magnetic or magnetizable pigment particles (220).

FIG. 3A illustrates an example of an assembly suitable for producing optical effect layers (OELs) comprising a plurality of magnetic or magnetizable pigment particles following a negative curvature (orientation of the pigment particles in a convex fashion (as in FIG. 2A) produced by exposing a wet (i.e. not yet hardened) coating layer (310) to the magnetic field of a magnetic-field generating device (370) disposed on the opposite side of the substrate (330) to the coating layer (310). The assembly comprises a UV-Vis irradiation source (340); an optional supporting plate (350) preferably made of a non-magnetic material having a thickness between 0.1 to 25 mm, preferably between 0.5 to 5 mm; and a magnetic-field generating device (370). As illustrated in FIG. 3A, the hardening of the coating layer so as to fix/freeze the orientation of the pigment particles is carried out by using a UV-Vis irradiation source (340) facing the side of the substrate (330) carrying the coating layer (310) and is carried out simultaneously or at least partially simultaneously with the orientation of the magnetic or magnetizable pigment particles by the use of the magnetic-field generating device (370). Examples of simultaneous hardening methods have been disclosed for example in WO 2012/038531 A1.

FIG. 3B illustrates an example of an assembly suitable for producing optical effect layers (OELs) comprising a plurality of magnetic or magnetizable pigment particles following a positive curvature (orientation of the pigment particles in a concave fashion as shown in FIG. 2B) produced by exposing a wet (i.e. not yet hardened) coating layer (310) to the magnetic field of a magnetic-field generating device (370) disposed on the side of the substrate (330) carrying the coating layer (310). The assembly comprises a UV-Vis irradiation source (340); an optional supporting plate (350) preferably made of a non-magnetic material having a thickness between 0.1 to 25 mm, preferably between 0.5 and 5 mm; and a magnetic-field generating device (370). As illustrated in FIG. 3B, the hardening of the coating layer so as to fix/freeze the orientation of the pigment particles is carried out by using a UV-Vis irradiation source (340) facing the optional supporting plate (350) and is carried out simultaneously or at least partially simultaneously with the orientation of the magnetic or magnetizable pigment particles by the use of the magnetic-field generating device (370). In this example, the substrate (330) and the optional supporting plate (350) must be transparent or at least partially transparent to the irradiation used for hardening the coating layer (310). Examples of simultaneous or at least partially simultaneous hardening methods through the substrate have been disclosed in the co-pending application EP 14178901.6.

The present invention further provides optical effect layers (OELs) obtained by the process described herein.

The single hardened layer is obtained by applying on the substrate comprising the photomask a radiation curable coating composition comprising one or more photoinitiators and a plurality of magnetic or magnetizable pigment particles so as to form a coating layer, said coating layer being in a first state and said coating layer at least partially facing the photomask, by optionally exposing the coating layer to the magnetic field of a first magnetic-field-generating device, and by hardening said radiation curable coating composition with a UV-Vis irradiation source to a second state so as to fix/freeze the magnetic or magnetizable pigment particles in their adopted positions and orientations. The first and second states described herein can be provided by using a binder material that shows a sufficient increase in viscosity in reaction to an exposure to UV-Vis radiation. That is, when the coating layer is hardened, said layer converts into the second state, i.e. a highly viscous or hardened or solid state, where the magnetic or magnetizable pigment particles are fixed/frozen in their current positions and orientations and can no longer move nor rotate within the layer.

The processes described herein comprise a first step consisting of applying on the substrate comprising the photomask described herein a radiation curable coating composition comprising one or more photoinitiators and a plurality of magnetic or magnetizable pigment particles so as to form a coating layer, said coating layer being in a first state and said coating layer at least partially facing the photomask. Preferably, said step is carried out by a printing process preferably selected from the group consisting of screen printing, rotogravure printing and flexography printing.

Screen printing (also referred in the art as silkscreen printing) is a stencil process whereby a composition or ink is transferred to a surface through a stencil supported by a fine fabric mesh of silk, mono- or multi-filaments made of synthetic fibers such as for example polyamides or polyesters or metal threads stretched tightly on a frame made for example of wood or a metal (e.g. aluminum or stainless steel). Alternatively, the screen-printing mesh may be a chemically etched, a laser-etched, or a galvanically formed porous metal foil, e.g. a stainless steel foil. The pores of the mesh are block-up in the non-image areas and left open in the image area, the image carrier being called the screen. Screen printing might be flat-bed or rotary. Screen printing is further described for example in *The Printing ink manual*, R. H. Leach and R. J. Pierce, Springer Edition, 5$^{th}$ Edition, pages 58-62 and in *Printing Technology*, J. M. Adams and P. A. Dolin, Delmar Thomson Learning, 5$^{th}$ Edition, pages 293-328.

Rotogravure (also referred in the art as gravure printing) is a printing process wherein the image elements are engraved into the surface of a cylinder. The non-image areas are at a constant original level. Prior to printing, the entire printing plate (non-printing and printing elements) is inked and flooded with a composition or ink. The composition or ink is removed from the non-image by a wiper or a blade before printing, so that composition or ink remains only in the cells. The image is transferred from the cells to the substrate by a pressure typically in the range of 2 to 4 bars and by the adhesive forces between the substrate and the ink. The term rotogravure does not encompass intaglio printing processes (also referred in the art as engraved steel die or copper plate printing processes) which rely for example on a different type of ink. More details are provided in "Handbook of print media", Helmut Kipphan, Springer Edition, page 48 and in *The Printing ink manual*, R. H. Leach and R. J. Pierce, Springer Edition, $5^{th}$ Edition, pages 42-51.

Flexography preferably uses a unit with a doctor blade, preferably a chambered doctor blade, an anilox roller and plate cylinder. The anilox roller advantageously has small cells whose volume and/or density determines the composition or ink application rate. The doctor blade lies against the anilox roller and scrapes off surplus ink. The anilox roller transfers the composition or ink to the plate cylinder which finally transfers the composition or ink to the substrate. Specific design might be achieved using a designed photopolymer plate. Plate cylinders can be made from polymeric or elastomeric materials. Preparation of plate cylinders for flexography is described in *Printing Technology*, J. M. Adams and P. A. Dolin, Delmar Thomson Learning, $5^{th}$ Edition, pages 359-360 and in *The Printing ink manual*, R. H. Leach and R. J. Pierce, Springer Edition, $5^{th}$ Edition, pages 33-42.

The processes described herein further comprises a step b1) of hardening one or more first substrate areas carrying the coating layer through the substrate, said hardening being performed by irradiation with a UV-Vis irradiation source to a second state so as to fix/freeze the magnetic or magnetizable pigment particles in their positions and orientations; and a step c1) of exposing at least one or more second substrate areas carrying the coating layer which are in a first state due to the presence of the photomask of the substrate to the magnetic field of a magnetic-field-generating device thereby orienting the plurality of magnetic or magnetizable pigment particles so as to follow any magnetic or magnetizable pigment particles orientation pattern except a random orientation, preferably thereby orienting said plurality of magnetic or magnetizable pigment particles so as to follow a convex curvature when viewed from the side carrying the OEL, more preferably thereby orienting said plurality of magnetic or magnetizable pigment particles so that the OEL exhibit a negative rolling bar feature; and a step c2) of simultaneously, partially simultaneously or subsequently hardening by irradiation with a UV-Vis irradiation source at least the one or more second substrate areas carrying the coating layer to a second state so as to fix/freeze the magnetic or magnetizable pigment particles in their adopted positions and orientations FIG. 4 illustrates an example of a comparative process suitable for producing an OEL comprising a motif made of three areas, said process using two magnetic-field-generating devices and an external photomask. The two magnetic-field-generating devices allow the orientation of magnetic or magnetizable pigments particles (420) along the lines of a first magnetic field B1 and along the lines of a second magnetic field B2. The magnetic or magnetizable pigments particles (420) are comprised in a radiation curable coating composition (410) applied on a substrate (430), wherein said substrate may be disposed on an optional supporting plate (450). After the orientation of the magnetic or magnetizable pigment particles (420) along the lines of the first magnetic field B1, one area (W) of the radiation curable coating composition (410) is hardened with a UV-Vis irradiation source (440) equipped with a photomask (460). As a result of the use of the photomask (460), the areas (U) of the radiation curable coating composition (410) facing the photomask remain un-exposed to the irradiation and, thereby remain in a first state and un-hardened. In the un-exposed areas (U), the radiation curable coating composition (410) remains in a first state, i.e. liquid, and therefore the magnetic or magnetizable pigment particles (420) remain orientable. In a subsequent step, the magnetic or magnetizable pigment particles (420) in the not yet hardened areas (U) are oriented along the lines of the second magnetic field B2. Finally, the radiation curable coating composition is completely hardened by irradiation with a UV-Vis irradiation source (441), thereby fixing/freezing the orientation of the magnetic or magnetizable pigment particles (420) in areas U and W to produce the OEL. WO 02/090002 A2 discloses such a process.

Radiation curable coating compositions consist of compositions that may be hardened by UV-visible light radiation (hereafter referred as UV-Vis curable) or by E-beam radiation (hereafter referred as EB). Radiation curable compositions are known in the art and can be found in standard textbooks such as the series "Chemistry & Technology of UV & EB Formulation for Coatings, Inks & Paints", published in 7 volumes in 1997-1998 by John Wiley & Sons in association with SITA Technology Limited. According to one embodiment of the present invention, the radiation curable coating compositions described herein consist of UV-Vis curable coating composition. UV-Vis curing advantageously leads to very fast curing processes and hence drastically decreases the preparation time of the optical effect layer. Preferably the binder of the UV-Vis curable coating composition described herein is prepared from oligomers (also referred in the art as prepolymers) selected from the group consisting of radically curable compounds, cationically curable compounds and mixtures thereof.

Cationically curable compounds are cured by cationic mechanisms consisting of the activation by energy of one or more photoinitiators which liberate cationic species, such as acids, which in turn initiate the polymerization so as to form the binder. Radically curable compounds are cured by free radical mechanisms consisting of the activation by energy of one or more photoinitiators which liberate free radicals which in turn initiate the polymerization so as to form the binder. Preferably, the binder of the UV-Vis curable coating composition described herein is prepared from oligomers selected from the group consisting of oligomeric (meth) acrylates, vinyl ethers, propenyl ethers, cyclic ethers such as epoxides, oxetanes, tetrahydrofuranes, lactones, cyclic thioethers, vinyl and propenyl thioethers, hydroxyl-containing compounds and mixtures thereof. More preferably, the binder of the UV-Vis curable coating composition described herein is prepared from oligomers selected from the group consisting of oligomeric (meth)acrylates, vinyl ethers, propenyl ethers, cyclic ethers such as epoxides, oxetanes, tetrahydrofuranes, lactones and mixtures thereof. Typical examples of epoxides include without limitation glycidyl ethers, β-methyl glycidyl ethers of aliphatic or cycloaliphatic diols or polyols, glycidyl ethers of diphenols and polyphenols, glycidyl esters of polyhydric phenols, 1,4-butanediol diglycidyl ethers of phenolformalhedhyde novolak, resorcinol diglycidyl ethers, alkyl glycidyl ethers, glycidyl ethers comprising copolymers of acrylic esters (e.g. styrene-glycidyl methacrylate or methyl methacrylate-glycidyl acrylate), polyfunctional liquid and solid novolak glycidyl ethers resins, polyglycidyl ethers and poly(β-methylglycidyl) ethers, poly(N-glycidyl) compounds, poly(S-glycidyl) compounds, epoxy resins in which the glycidyl groups or β-methyl glycidyl groups are bonded to hetero atoms of different types, glycidyl esters of carboxylic acids and polycarboxylic acids, limonene monoxide, epoxidized soybean oil, bisphenol-A and bisphenol-F epoxy resins. Examples of suitable epoxides are disclosed in EP-B 2 125 713. Suitable examples of aromatic, aliphatic or cycloaliphatic vinyl ethers include without limitation compounds having at least one, preferably at least two, vinyl ether groups in the molecule. Examples of vinyl ethers include without limitation triethylene glycol divinyl ether, 1,4-cyclohexanedimethanol divinyl ether, 4-hydroxybutyl vinyl ether, propenyl ether of propylene carbonate, dodecyl vinyl ether, tert-butyl vinyl ether, tert-amyl vinyl ether, cyclohexyl vinyl ether, 2-ethylhexyl vinyl ether, ethylene glycol monovinyl ether, butanediol monovinyl ether, hexanediol monovinyl ether, 1,4-cyclohexanedimethanol monovinyl ether, diethylene glycol monovinyl ether, ethylene glycol divinyl ether, ethylene glycol butylvinyl ether, butane-1,4-diol divinyl ether, hexanediol divinyl ether, diethylene glycol divinyl ether, triethylene glycol divinyl ether, triethylene glycol methylvinyl ether, tetraethylene glycol divinyl ether, pluriol-E-200 divinyl ether, polytetrahydrofuran divinyl ether-290, trimethylolpropane trivinyl ether, dipropylene glycol divinyl ether, octadecyl vinyl ether, (4-cyclohexyl-methylene-oxyethene)-glutaric acid methyl ester and (4-butoxyethene)-iso-phthalic acid ester. Examples of hydroxy-containing compounds include without limitation polyester polyols such as for example polycaprolactones or polyester adipate polyols, glycols and polyether polyols, castor oil, hydroxy-functional vinyl and acrylic resins, cellulose esters, such as cellulose acetate butyrate, and phenoxy resins. Further examples of suitable cationically curable compounds are disclosed in EP 2 125 713 B1 and EP 0 119 425 B1.

According to one embodiment of the present invention, the binder of the UV-Vis curable coating composition described herein is prepared from radically curable compounds oligomeric selected from (meth)acrylates, preferably selected from the group consisting of epoxy (meth)acrylates, (meth)acrylated oils, polyester (meth)acrylates, aliphatic or aromatic urethane (meth)acrylates, silicone (meth)acrylates, amino (meth)acrylates, acrylic (meth)acrylates and mixtures thereof. The term "(meth)acrylate" in the context of the present invention refers to the acrylate as well as the corresponding methacrylate. The binder of the UV-Vis-curable coating composition described herein may be prepared with additional vinyl ethers and/or monomeric acrylates such as for example trimethylolpropane triacrylate (TMPTA), pentaerytritol triacrylate (PTA), tripropyleneglycoldiacrylate (TPGDA), dipropyleneglycoldiacrylate (DPGDA), hexanediol diacrylate (HDDA) and their polyethoxylated equivalents such as for example polyethoxylated trimethylolpropane triacrylate, polyethoxylated pentaerythritol triacrylate, polyethoxylated tripropyleneglycol diacrylate, polyethoxylated dipropyleneglycol diacrylate and polyethoxylated hexanediol diacrylate.

Alternatively, the binder of the UV-Vis curable coating composition described herein is a hybrid binder and may be prepared from a mixture of radically curable compounds and cationically curable compounds such as those described herein.

UV-Vis curing of a monomer, oligomer or prepolymer may require the presence of one or more photoinitiators and may be effected in a number of ways. As mentioned herein and as known by the man skilled in the art, the radiation curable coating compositions to be hardened on the substrate comprise one or more photoinitiators optionally with one or more photosensitizers, said one or more photoinitiators and optional one or more photosensitizers being selected according to its/their absorption spectrum/spectra in correlation with the emission spectrum of the radiation source. Depending on the degree of transmission of the electromagnetic radiation through the substrate, hardening of the coating layer may be obtained by increasing the irradiation time. However, depending on the substrate material, the irradiation time is limited by the substrate material and its sensitivity to the heat produced by the radiation source.

As known by those skilled in the art, the one or more photoinitiators are selected according to their absorption spectra and are selected to fit with the emission spectra of the radiation source. Depending on the monomers, oligomers or prepolymers used to prepare the binder comprised in the UV-Vis curable coating composition described herein, different photoinitiators might be used. Suitable examples of free radical photoinitiators are known to those skilled in the art and include without limitation acetophenones, benzophenones, alpha-aminoketones, alpha-hydroxyketones, phosphine oxides and phosphine oxide derivatives and benzyldimethyl ketals. Suitable examples of cationic photoinitiators are known to those skilled in the art and include without limitation onium salts such as organic iodonium salts (e.g. diaryl iodoinium salts), oxonium (e.g. triaryloxonium salts) and sulfonium salts (e.g. triarylsulphonium salts). Other examples of useful photoinitiators can be found in standard textbooks such as "Chemistry & Technology of UV & EB Formulation for Coatings, Inks & Paints", Volume III, "Photoinitiators for Free Radical Cationic and Anionic Polymerization", 2nd edition, by J. V. Crivello & K. Dietliker, edited by G. Bradley and published in 1998 by John Wiley & Sons in association with SITA Technology Limited. It may also be advantageous to include a sensitizer in conjunction with the one or more photoinitiators in order to achieve efficient curing. Typical examples of suitable photosensitizers include without limitation isopropyl-thioxanthone (ITX), 1-chloro-2-propoxy-thioxanthone (CPTX), 2-chloro-thioxanthone (CTX) and 2,4-diethyl-thioxanthone (DETX) and mixtures thereof. The one or more photoinitiators comprised in the UV-Vis curable optically variable compositions are preferably present in an amount from about 0.1 to about 20 weight percent, more preferably about 1 to about 15 weight percent, the weight percents being based on the total weight of the UV-Vis curable optically variable compositions.

The radiation curable coating composition comprising a plurality of magnetic or magnetizable pigment particles forms a coating layer when applied, preferably by a printing process such as those described herein, on the substrate comprising the photomask described herein, wherein said coating layer being in a first state and said coating layer at least partially facing the photomask.

The radiation curable coating composition described herein as well as the coating layer described herein comprises a plurality of magnetic or magnetizable pigment particles, preferably optically variable magnetic or magnetizable pigment particles. Preferably, the magnetic or magnetizable pigment particles described herein are present in an amount from about 5 wt-% to about 40 wt-%, more preferably about 10 wt-% to about 30 wt-%, the weight percentages being based on the total weight of the radiation curable coating composition.

The magnetic or magnetizable pigment particles, preferably optically variable magnetic or magnetizable pigment particles, described herein are particularly suitable in radiation curable coating compositions comprising a binder material for producing an optical effect layer, i.e. for producing a magnetically induced image. Preferably, the magnetic or magnetizable pigment particles are non-spherical magnetic or magnetizable pigment particles.

Non-spherical magnetic or magnetizable pigment particles described herein are defined as having, due to their non-spherical shape, non-isotropic reflectivity with respect to an incident electromagnetic radiation for which the hardened binder material is at least partially transparent. As used herein, the term "non-isotropic reflectivity" denotes that the proportion of incident radiation from a first angle that is reflected by a particle into a certain (viewing) direction (a second angle) is a function of the orientation of the particles, i.e. that a change of the orientation of the particle with respect to the first angle can lead to a different magnitude of the reflection to the viewing direction. Preferably, the non-spherical magnetic or magnetizable pigment particles described herein have a non-isotropic reflectivity with respect to incident electromagnetic radiation in some parts or in the complete wavelength range of from about 200 to about 2500 nm, more preferably from about 400 to about 700 nm, such that a change of the particle's orientation results in a change of reflection by that particle into a certain direction. As known by the man skilled in the art, the magnetic or magnetizable pigment particles described herein are different from conventional pigments, said conventional pigment particles displaying the same color for all viewing angles, whereas the magnetic or magnetizable pigment particles described herein exhibit non-isotropic reflectivity as described hereabove.

The non-spherical magnetic or magnetizable pigment particles are preferably prolate or oblate ellipsoid-shaped, platelet-shaped or needle-shaped particles or a mixture of two or more thereof and more preferably platelet-shaped particles.

Suitable examples of magnetic or magnetizable pigment particles, in particular non-spherical magnetic or magnetizable pigment particles, described herein include without limitation pigment particles comprising a magnetic metal selected from the group consisting of cobalt (Co), iron (Fe), gadolinium (Gd) and nickel (Ni); a magnetic alloy of iron, manganese, cobalt, nickel or a mixture of two or more thereof; a magnetic oxide of chromium, manganese, cobalt, iron, nickel or a mixture of two or more thereof; or a mixture of two or more thereof. The term "magnetic" in reference to the metals, alloys and oxides is directed to ferromagnetic or ferrimagnetic metals, alloys and oxides. Magnetic oxides of chromium, manganese, cobalt, iron, nickel or a mixture of two or more thereof may be pure or mixed oxides. Examples of magnetic oxides include without limitation iron oxides such as hematite ($Fe_2O_3$), magnetite ($Fe_3O_4$), chromium dioxide ($CrO_2$), magnetic ferrites ($MFe_2O_4$), magnetic spinels ($MR_2O_4$), magnetic hexaferrites ($MFe_{12}O_{19}$), magnetic orthoferrites ($RFeO_3$), magnetic garnets $M_3R_2(AO_4)_3$, wherein M stands for two-valent metal, R stands for three-valent metal, and A stands for four-valent metal.

Examples of magnetic or magnetizable pigment particles, in particular non-spherical magnetic or magnetizable pigment particles, described herein include without limitation pigment particles comprising a magnetic layer M made from one or more of a magnetic metal such as cobalt (Co), iron (Fe), gadolinium (Gd) or nickel (Ni); and a magnetic alloy of iron, cobalt or nickel, wherein said magnetic or magnetizable pigment particles may be multilayered structures comprising one or more additional layers. Preferably, the one or more additional layers are layers A independently made from one or more selected from the group consisting of metal fluorides such as magnesium fluoride ($MgF_2$), silicium oxide (SiO), silicium dioxide ($SiO_2$), titanium oxide ($TiO_2$), and aluminum oxide ($Al_2O_3$), more preferably silicium dioxide ($SiO_2$); or layers B independently made from one or more selected from the group consisting of metals and metal alloys, preferably selected from the group consisting of reflective metals and reflective metal alloys, and more preferably selected from the group consisting of aluminum (Al), chromium (Cr), and nickel (Ni), and still more preferably aluminum (Al); or a combination of one or more layers A such as those described hereabove and one or more layers B such as those described hereabove. Typical examples of the magnetic or magnetizable pigment particles being multilayered structures described hereabove include without limitation A/M multilayer structures, A/M/A multilayer structures, A/M/B multilayer structures, A/B/M/A multilayer structures, A/B/M/B multilayer structures, A/B/M/B/A multilayer structures, B/M multilayer structures, B/M/B multilayer structures, B/A/M/A multilayer structures, B/A/M/B multilayer structures, B/A/M/B/A multilayer structures, wherein the layers A, the magnetic layers M and the layers B are chosen from those described hereabove.

The radiation curable coating composition described herein may comprise a plurality of optically variable magnetic or magnetizable pigment particles, preferably non-spherical optically variable magnetic or magnetizable pigment particles. The radiation curable coating composition described herein may comprise a plurality of optically variable magnetic or magnetizable pigment particles, preferably non-spherical optically variable magnetic or magnetizable pigment particles and magnetic or magnetizable pigment particles, preferably non-spherical magnetic or magnetizable pigment particles, having no optically variable properties. In addition to the overt security provided by the colorshifting property of the optically variable magnetic or magnetizable pigment particles, which allows easily detecting, recognizing and/or discriminating an article or security document carrying a coating composition or a coating layer comprising the optically variable magnetic or magnetizable pigment particles described herein from their possible counterfeits using the unaided human senses, the optical properties of the optically variable magnetic or magnetizable pigment particles may also be used as a machine readable tool for the recognition of the OEL. Thus, the optical properties of the optically variable magnetic or magnetizable pigment particles may simultaneously be used as a covert or semi-covert security feature in an authentication process wherein the optical (e.g. spectral) properties of the pigment particles are analyzed. Moreover, the use of optically variable magnetic or magnetizable pigment particles, in particular non-spherical optically variable magnetic or magnetizable pigment particles, in coating layers for producing an OEL enhances the significance of the OEL as a security feature in security document applications, because such materials are reserved to the security document printing industry and are not commercially available to the public.

As mentioned above, preferably at least a part of the plurality of magnetic or magnetizable pigment particles is constituted by optically variable magnetic or magnetizable pigment particles, preferably non-spherical optically variable magnetic or magnetizable pigment particles. These can more preferably be selected from the group consisting of magnetic thin-film interference pigment particles, magnetic cholesteric liquid crystal pigment particles, interference coated pigment particles comprising a magnetic material and mixtures of two or more thereof. The magnetic thin-film interference pigment particles, magnetic cholesteric liquid crystal pigment particles and interference coated pigment particles comprising a magnetic material described herein are preferably prolate or oblate ellipsoid-shaped, platelet-shaped or needle-shaped particles or a mixture of two or more thereof and more preferably platelet-shaped particles.

Magnetic thin film interference pigment particles are known to those skilled in the art and are disclosed e.g. in U.S. Pat. No. 4,838,648; WO 2002/073250 A2; EP 0 686 675 B1; WO 2003/000801 A2; U.S. Pat. No. 6,838,166; WO 2007/131833 A1; EP 2 402 401 A1 and in the documents cited therein. Preferably, the magnetic thin film interference pigment particles comprise pigment particles having a five-layer Fabry-Perot multilayer structure and/or pigment particles having a six-layer Fabry-Perot multilayer structure and/or pigment particles having a seven-layer Fabry-Perot multilayer structure.

Preferred five-layer Fabry-Perot multilayer structures consist of absorber/dielectric/reflector/dielectric/absorber multilayer structures wherein the reflector and/or the absorber is also a magnetic layer, preferably the reflector and/or the absorber is a magnetic layer comprising nickel, iron and/or cobalt, and/or a magnetic alloy comprising nickel, iron and/or cobalt and/or a magnetic oxide comprising nickel (Ni), iron (Fe) and/or cobalt (Co).

Preferred six-layer Fabry-Perot multilayer structures consist of absorber/dielectric/reflector/magnetic/dielectric/absorber multilayer structures.

Preferred seven-layer Fabry Perot multilayer structures consist of absorber/dielectric/reflector/magnetic/reflector/dielectric/absorber multilayer structures such as disclosed in U.S. Pat. No. 4,838,648.

Preferably, the reflector layers described herein are independently made from one or more selected from the group consisting of metals and metal alloys, preferably selected from the group consisting of reflective metals and reflective metal alloys, more preferably selected from the group consisting of aluminum (Al), silver (Ag), copper (Cu), gold (Au), platinum (Pt), tin (Sn), titanium (Ti), palladium (Pd), rhodium (Rh), niobium (Nb), chromium (Cr), nickel (Ni), and alloys thereof, even more preferably selected from the group consisting of aluminum (Al), chromium (Cr), nickel (Ni) and alloys thereof, and still more preferably aluminum (Al). Preferably, the dielectric layers are independently made from one or more selected from the group consisting of metal fluorides such as magnesium fluoride ($MgF_2$), aluminum fluoride ($AlF_3$), cerium fluoride ($CeF_3$), lanthanum fluoride ($LaF_3$), sodium aluminum fluorides (e.g. $Na_3AlF_6$), neodymium fluoride ($NdF_3$), samarium fluoride ($SmF_3$), barium fluoride ($BaF_2$), calcium fluoride ($CaF_2$), lithium fluoride (LiF), and metal oxides such as silicium oxide (SiO), silicium dioxide ($SiO_2$), titanium oxide ($TiO_2$), aluminum oxide ($Al_2O_3$), more preferably selected from the group consisting of magnesium fluoride ($MgF_2$) and silicium dioxide ($SiO_2$) and still more preferably magnesium fluoride ($MgF_2$). Preferably, the absorber layers are independently made from one or more selected from the group consisting of aluminum (Al), silver (Ag), copper (Cu), palladium (Pd), platinum (Pt), titanium (Ti), vanadium (V), iron (Fe) tin (Sn), tungsten (W), molybdenum (Mo), rhodium (Rh), Niobium (Nb), chromium (Cr), nickel (Ni), metal oxides thereof, metal sulfides thereof, metal carbides thereof, and metal alloys thereof, more preferably selected from the group consisting of chromium (Cr), nickel (Ni), metal oxides thereof, and metal alloys thereof, and still more preferably selected from the group consisting of chromium (Cr), nickel (Ni), and metal alloys thereof. Preferably, the magnetic layer comprises nickel (Ni), iron (Fe) and/or cobalt (Co); and/or a magnetic alloy comprising nickel (Ni), iron (Fe) and/or cobalt (Co); and/or a magnetic oxide comprising nickel (Ni), iron (Fe) and/or cobalt (Co). When magnetic thin film interference pigment particles comprising a seven-layer Fabry-Perot structure are preferred, it is particularly preferred that the magnetic thin film interference pigment particles comprise a seven-layer Fabry-Perot absorber/dielectric/reflector/magnetic/reflector/dielectric/absorber multilayer structure consisting of a Cr/Mg $F_2$/Al/N i/Al/Mg $F_2$/Cr multilayer structure.

The magnetic thin film interference pigment particles described herein may be multilayer pigment particles being considered as safe for human health and the environment and being based for example on five-layer Fabry-Perot multilayer structures, six-layer Fabry-Perot multilayer structures and seven-layer Fabry-Perot multilayer structures, wherein said pigment particles include one or more magnetic layers comprising a magnetic alloy having a substantially nickel-free composition including about 40 wt-% to about 90 wt-% iron, about 10 wt-% to about 50 wt-% chromium and about 0 wt-% to about 30 wt-% aluminum. Typical examples of multilayer pigment particles being considered as safe for human health and the environment can be found in EP 2 402 401 A1 which is hereby incorporated by reference in its entirety.

Magnetic thin film interference pigment particles described herein are typically manufactured by a conventional deposition technique of the different required layers onto a web. After deposition of the desired number of layers, e.g. by physical vapor deposition (PVD), chemical vapor deposition (CVD) or electrolytic deposition, the stack of layers is removed from the web, either by dissolving a release layer in a suitable solvent, or by stripping the material from the web. The so-obtained material is then broken down to flakes which have to be further processed by grinding, milling (such as for example jet milling processes) or any suitable method so as to obtain pigment particles of the required size. The resulting product consists of flat flakes with broken edges, irregular shapes and different aspect ratios. Further information on the preparation of suitable magnetic thin film interference pigment particles can be found e.g. in EP 1 710 756 A1 and EP 1 666 546 A1 which are hereby incorporated by reference.

Suitable magnetic cholesteric liquid crystal pigment particles exhibiting optically variable characteristics include without limitation magnetic monolayered cholesteric liquid crystal pigment particles and magnetic multilayered cholesteric liquid crystal pigment particles. Such pigment particles are disclosed for example in WO 2006/063926 A1, U.S. Pat. No. 6,582,781 and U.S. Pat. No. 6,531,221. WO 2006/063926 A1 discloses monolayers and pigment particles obtained therefrom with high brilliance and colorshifting properties with additional particular properties such as magnetizability. The disclosed monolayers and pigment particles, which are obtained therefrom by comminuting said monolayers, include a three-dimensionally crosslinked cholesteric liquid crystal mixture and magnetic nanoparticles. U.S. Pat. No. 6,582,781 and U.S. Pat. No. 6,410,130 disclose platelet-shaped cholesteric multilayer pigment particles which comprise the sequence $A^1/B/A^2$, wherein $A^1$ and $A^2$ may be identical or different and each comprises at least one cholesteric layer, and B is an interlayer absorbing all or some of the light transmitted by the layers $A^1$ and $A^2$ and imparting magnetic properties to said interlayer. U.S. Pat. No. 6,531,221 discloses platelet-shaped cholesteric multilayer pigment particles which comprise the sequence A/B and optionally C, wherein A and C are absorbing layers comprising pigment particles imparting magnetic properties, and B is a cholesteric layer.

Suitable interference coated pigments comprising one or more magnetic materials include without limitation structures consisting of a substrate selected from the group consisting of a core coated with one or more layers, wherein at least one of the core or the one or more layers have magnetic properties. For example, suitable interference coated pigments comprise a core made of a magnetic material such as those described hereabove, said core being coated with one or more layers made of one or more metal oxides, or they have a structure consisting of a core made of synthetic or natural micas, layered silicates (e.g. talc, kaolin and sericite), glasses (e.g. borosilicates), silicium dioxides ($SiO_2$), aluminum oxides ($Al_2O_3$), titanium oxides ($TiO_2$), graphites and mixtures of two or more thereof. Furthermore, one or more additional layers such as coloring layers may be present.

The magnetic or magnetizable pigment particles described herein may be surface treated so as to protect them against any deterioration that may occur in the radiation curable coating composition and coating layer and/or to facilitate their incorporation in said radiation curable coating composition and coating layer; typically corrosion inhibitor materials and/or wetting agents may be used.

The radiation curable coating compositions described herein may further comprise one or more additives including without limitation compounds and materials which are used for adjusting physical, rheological and chemical parameters of the composition such as the viscosity (e.g. solvents and surfactants), the consistency (e.g. anti-settling agents, fillers and plasticizers), the foaming properties (e.g. antifoaming agents), the lubricating properties (waxes), UV stability (photosensitizers and photostabilizers) and adhesion properties, etc. Additives described herein may be present in the radiation curable coating composition disclosed herein in amounts and in forms known in the art, including in the form of so-called nano-materials where at least one of the dimensions of the particles is in the range of 1 to 1000 nm.

The radiation curable coating composition described herein may further comprise one or more marker substances or taggants and/or one or more machine readable materials selected from the group consisting of magnetic materials (different from the magnetic or magnetizable pigment particles described herein), luminescent materials, electrically conductive materials and infrared-absorbing materials. As used herein, the term "machine readable material" refers to a material which exhibits at least one distinctive property which is not perceptible by the naked eye, and which can be comprised in a layer so as to confer a way to authenticate said layer or article comprising said layer by the use of a particular equipment for its authentication.

The radiation curable coating compositions described herein may be prepared by dispersing or mixing the binder described herein, and the one or more additives when present in the presence of the binder described herein. The one or more photoinitiators may be added to the composition either during the dispersing or mixing step of all other ingredients or may be added at a later stage.

Figure 5A:
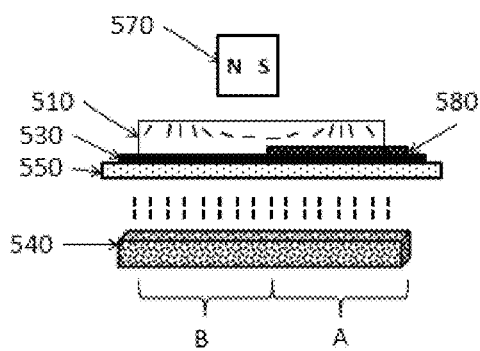
FIG. 5A schematically illustrate an example of a process using a photomask (580) comprised on a substrate (530) and located between a coating layer (510) and the substrate (530), a magnetic-field generating device (570) and a UV-Vis irradiation source (540) suitable for simultaneously or partially simultaneously hardening the coating layer (510) comprising a plurality of magnetic or magnetizable pigment particles so as to produce an optical effect following a positively curved magnetic field line in a concave fashion.
Figure 5B:
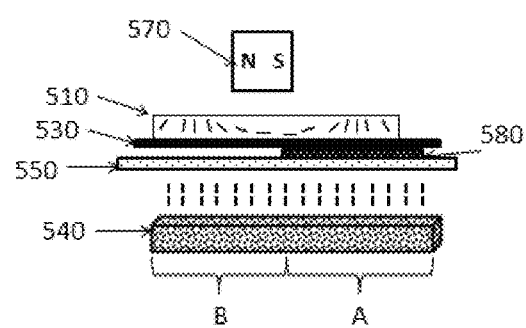
FIG. 5B schematically illustrate an example of a process using a photomask (580) comprised on a substrate (530) and located on the side of the substrate (530) opposite to the side carrying a coating layer (510) comprising plurality of magnetic or magnetizable pigment particles, a magnetic-field generating device (570) and a UV-Vis irradiation source (540) suitable for simultaneously or partially simultaneously hardening the coating layer (510) comprising plurality of magnetic or magnetizable pigment particles so as to produce an optical effect following a positively curved magnetic field line in a concave fashion.
Figure 5C:
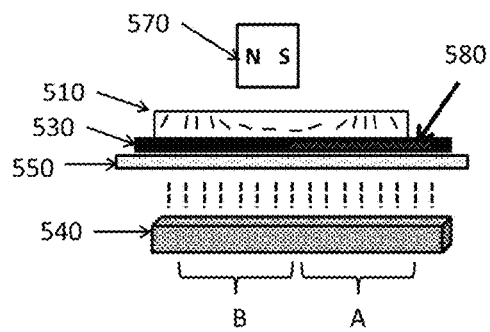
FIG. 5C schematically illustrate an example of a process using a photomask (580) comprised in a substrate (530), a magnetic-field generating device (570) and a UV-Vis irradiation source (540) suitable for simultaneously or partially simultaneously hardening a coating layer (510) comprising plurality of magnetic or magnetizable pigment particles so as to produce an optical effect following a positively curved magnetic field line in a concave fashion.

According to one aspect of the present invention, the substrate described herein comprises a photomask, wherein said photomask is on the substrate (as illustrated in FIG. 5A-B) or in the substrate (as illustrated in FIG. 5C).

The photomasks described herein may be continuous or may be discontinuous Preferably, the photomasks described herein are discontinuously present on the substrate or in the substrate. Preferably, the photomasks described herein are in the form of indicia or comprise one or more gaps (i.e. photomasks described herein comprise one or more material-free areas) in the form of indicia. As used herein, the term "indicia" shall mean discontinuous layers such as patterns, including without limitation symbols, alphanumeric symbols, motifs, letters, words, numbers, logos and drawings.

The presence of the photomask described herein advantageously allows a selective hardening of the coating layer described herein so as to form a motif made of at least two areas, preferably at least two adjacent areas, comprising magnetic or magnetizable pigment particles having a different magnetic or magnetizable pigment particles orientation pattern.

The photomasks described herein consist of an irradiation blocking layer, preferably a UV-absorbing layer, an irradiation diffusing layer or an irradiation reflecting layer, with adequate irradiation absorption, irradiation diffusion or irradiation reflection to prevent the hardening of the coating layer in the one or more areas facing said photomasks.

The use of a photomask described herein that is applied on or in the substrate described herein, instead of using a photomask fitted on an irradiation source such as described in FIG. 4, provides a photomask that moves on a printing machine or press simultaneously and concomitantly with the coating layer to be hardened, such that a continuous printing process may be used. Furthermore, the use of said photomask results in an exact registration of the applied photomask with the magnetic or magnetizable pigment particles orientation patterns within the coating layer. This is in particular useful for creating overt security features, comprising for example an OEL and a visible photomask, that are easy to identify and to authenticate: the shape and position of the OEL and of the visible photomask may be selected such that it is possible to verify the perfect registration of the visible photomask and of the magnetic or magnetizable pigment particles orientation patterns.

As shown in FIG. 5A, the photomask (580) described herein may be applied on the same side of the substrate as the coating layer (510), i.e. the photomask (580) is an intermediate layer comprised between the substrate (530) and the coating layer (510). Alternatively and as shown in FIG. 5B, the photomask (580) described herein may be applied on the opposite side of the substrate (530) as the coating layer (510), i.e. the photomask (580) faces the environment. Alternatively and as shown in FIG. 5C, the photomask (580) described herein may be comprised in the substrate (530).

The photomask and the coating layer comprising the magnetic or magnetizable pigment particles described herein are at least partly facing each other on the same or on opposite side of the substrate; or alternatively, the photomask and the coating layer comprising the magnetic or magnetizable pigment particles described herein are at least partly facing each other, said photomask being within the substrate and said coating layer being on the substrate. Accordingly the coating layer is either applied at least partly over the photomask on the same side of the substrate, or the coating layer and the photomask are printed each on one side of the substrate in areas that are at least partly overlapping when the substrate is seen in transmission.

According to another aspect of the present invention, the substrate described herein may comprise more than one photomasks, i.e. the substrate described herein may comprise one or more photomasks such as those described herein. When the substrate comprises more than one photomasks, said more than one photomasks may be on the substrate, in the substrate, or alternatively may be on and in the substrate. According to another aspect of the present invention, the substrate described herein comprises more than one photomasks, wherein one of said more than one photomasks is present in the substrate and another of said more than one photomasks is present on the substrate.

According to another aspect of the present invention, when the substrate comprises more than one photomasks, said more than one photomasks may be spaced apart on the same side of the substrate, on opposite sides of the substrate, or alternatively on and in the substrate. Alternatively, the more than one photomasks may be partially or completely overlapping on the same side of the substrate, on opposite sides of the substrate, or alternatively on and in the substrate.

According to another aspect of the present invention, one of said more than one photomasks may be produced onto an auxiliary substrate such as for example a security thread, security stripe, a foil, a decal, a window or a label and consequently transferred to the substrate in a separate step by a transfer process.

When more than one photomasks are present on, in, or on and in the substrate, said more than one photomasks may consist of different layers, i.e. e.g. a UV absorbing layer and an irradiation reflecting layer. In other words, the presence of the photomask or the more than one photomasks described herein on one or more areas of the substrate hinders or limits electromagnetic radiation, in particular UV irradiation, through the applied photomask(s); in particular, it hinders or limits electromagnetic radiation at the wavelength(s) of the light exposure used for the hardening of the coating layer comprising magnetic or magnetizable pigment particles so as to selectively harden areas of the coating layer not facing the photomask(s) (as illustrated in FIGS. 5A and 5B) by irradiation through the substrate and the photomask.

The photomasks described herein may be applied on and/or within the substrate described herein either by a printing process, by a transfer process or by a metallization process, preferably by a printing process. The photomask described herein may be applied on and/or within the substrate described herein either during the manufacture of said substrate or in a later stage.

The photomask described herein may be applied in the substrate described herein during the manufacture of said substrate for example by a process selected from the group consisting of foil stampings, inclusions of a security thread, watermark formations, applications of opacifying layers.

The performance and efficiency of the selective hardening described herein depends on the photomask, in particular it depends on various parameters including the photomask chemical composition, the process used to apply said photomask, the photomask thickness and optical density; on the substrate, in particular it depends on various parameters including the substrate optical density; on the radiation curable coating composition comprising the magnetic or magnetizable pigment particles, in particular it depends on the chemical reactivity of the coating layer, the type of photoinitiator comprised in the coating layer; and on the hardening process, in particular it depends on the irradiation source emission spectrum and its power as well as the electromagnetic radiation exposure time.

The photomask is advantageously chosen such that the transmission of the electromagnetic radiation through the photomask is fully hindered or is very low so that the coating layer facing the photomask, i.e. masked area (see "A" areas in FIGS. 5A and 5B) is not hardened during the hardening step (step b1)) through the substrate and photomask. Accordingly, the performance and efficiency of the selective hardening described herein depends of the optical density of the combination of the photomask and substrate (hereafter referred as "combined photomask and substrate"). The transmission of the electromagnetic radiation through the substrate in one or more areas lacking the photomask, i.e. unmasked area (see "B" areas in FIGS. 5A and 5B) must be high enough such that the hardening of the radiation curable coating composition hardening step (step b1)) is carried out by irradiation through said substrate. In other words, the substrate optical density is advantageously chosen so that the hardening of the radiation curable coating composition allows fixing/freezing the orientation of the magnetic or magnetizable pigment particles orientation through said substrate in the one or more areas lacking the photomask (see areas noted "B" in FIGS. 5A and 5B).

Depending on the degree of transmission of the electromagnetic radiation through the substrate, hardening of the coating layer may be obtained by increasing the irradiation time. However, depending on the substrate material, the irradiation time is limited by the substrate material and its sensitivity to the heat produced by the irradiation source.

The substrate described herein is preferably selected from the group consisting of papers or other fibrous materials such as cellulose, paper-containing materials, glasses, ceramics, plastics and polymers, composite materials and mixtures or combinations thereof. Typical paper, paper-like or other fibrous materials are made from a variety of fibers including without limitation abaca, cotton, linen, wood pulp, and blends thereof. As is well known to those skilled in the art, cotton and cotton/linen blends are preferred for banknotes, while wood pulp is commonly used in non-banknote security documents. Typical examples of plastics and polymers include polyolefins such as polyethylene (PE) and polypropylene (PP), polyamides, polyesters such as poly(ethylene terephthalate) (PET), poly(1,4-butylene terephthalate) (PBT), poly(ethylene 2,6-naphthoate) (PEN) and polyvinylchlorides (PVC). Spunbond olefin fibers such as those sold under the trademark Tyvek® may also be used as substrate. Typical examples of composite materials include without limitation multilayer structures or laminates of paper and at least one plastic or polymer material such as those described hereabove as well as plastic and/or polymer fibers incorporated in a paper-like or fibrous material such as those described hereabove. As known by the man skilled in the art, the substrate may further comprise conventional additives such as sizing agents, whiteners, processing aids, reinforcing or wet strengthening agents etc.

As used herein, the photomask optical density, hereafter denoted $D_M$, is defined as the decimal logarithm of the ratio of the average transmission of the substrate $\langle T_S \rangle$ over the average transmission of the combined photomask and substrate, $\langle T_{SM} \rangle$:

$$D_M = \log_{10}\left(\frac{\langle T_S \rangle}{\langle T_{SM} \rangle}\right)$$

The average transmission of the substrate $\langle T_S \rangle$ is calculated as the ratio of a) the integral (calculated between $\lambda_1$ and $\lambda_2$) of the product of the measured transmission spectrum of the substrate $T_S(\lambda)$ and the measured emission spectrum of the irradiation source S(λ), over b) the integral (calculated between $\lambda_1$ and $\lambda_2$) of the measured emission spectrum of the irradiation source S(λ):

$$\langle T_s \rangle = \frac{\int_{\lambda_1}^{\lambda_2} S(\lambda) T_S(\lambda) d\lambda}{\int_{\lambda_1}^{\lambda_2} S(\lambda) d\lambda}$$

The integration interval of $\lambda_1$ to $\lambda_2$ is selected such that it corresponds to the region of electromagnetic radiation in which the emission spectrum of the irradiation source overlaps with the absorption spectrum of the photoinitiator used in the coating layer thus resulting in interaction leading to a chemical reaction of the photoinitiator and consequently to the hardening of the coating layer. Therefore the integration interval of $\lambda_1$ to $\lambda_2$ relates to the region of electromagnetic radiation in which the photomask must absorb electromagnetic radiation such as to prevent a photo-induced chemical reaction of the photoinitiator and thus to hinder the hardening of the coating layer printed on or facing the photomask.

The transmission $T_{SM}(\lambda)$ is related to the transmission from the combined photomask and substrate:

$T_{SM}(\lambda) = T_S(\lambda) T_M(\lambda)$ wherein $T_S(\lambda)$ is the transmission of the substrate at the wavelength λ, and $T_M(\lambda)$ is the transmission of the photomask at the wavelength λ.

The average transmission of the combined photomask and substrate, $\langle T_{SM} \rangle$, is calculated as the ratio of a) the integral (calculated between $\lambda_1$ and $\lambda_2$) of the product of the measured transmission spectrum of the combined photomask and substrate $T_{SM}(\lambda)$) and the measured emission spectrum of the irradiation source S(λ), over b) the integral (calculated between $\lambda_1$ and $\lambda_2$) of the measured emission spectrum of the irradiation source S(λ):

$$\langle T_{SM} \rangle = \frac{\int_{\lambda_1}^{\lambda_2} S(\lambda) T_{SM}(\lambda) d\lambda}{\int_{\lambda_1}^{\lambda_2} S(\lambda) d\lambda} = \frac{\int_{\lambda_1}^{\lambda_2} S(\lambda) T_M(\lambda) T_S(\lambda) d\lambda}{\int_{\lambda_1}^{\lambda_2} S(\lambda) d\lambda}$$

Thus the photomask optical density $D_M$ described herein may be used to compare various photomasks. A photomask characterized by a higher $D_M$ value will absorb more efficiently the electromagnetic radiations and thus provide a more efficient photomask than a photomask with a relative lower $D_M$ value.

Suitable photomasks for the process described herein have an optical density $D_M$ calculated as described hereabove equal to or higher than about 1.0, preferably equal to or higher than about 1.1 and more preferable equal to or higher than about 1.2.

The photomask described herein may be a UV-absorbing photomask, an irradiation diffusing or an irradiation reflecting photomask. When the photomask is applied on the substrate, said photomask may be prepared by applying a UV-absorbing or irradiation-diffusing or irradiation-reflecting photomask composition or material, respectively, to the substrate described herein by a process selected from the group consisting of printing and coating processes. When the photomask is applied on an auxiliary substrate, such as for example a security thread, a security stripe, a foil, a decal, a window or a label and consequently transferred to the substrate in a separate step by a transfer process, said photomask may be prepared by applying a UV-absorbing or irradiation-diffusing or irradiation-reflecting photomask composition or material to the auxiliary substrate described herein by a process selected from the group consisting of printing processes, coating processes, chemical vapor deposition processes (CVP), and physical vapor deposition processes (PVD).

According to a preferred embodiment, the photomask described herein consists of an irradiation reflecting photomask being a metalized layer (described hereafter as metalized photomask). The metalized photomask described herein may be directly applied on the substrate, or alternatively the metalized photomask may be applied on a transfer substrate, such as e.g. a foil or a stripe, that is subsequently applied onto the substrate.

Typical example of metals suitable for the metalized photomask include without limitation aluminum (Al), chromium (Cr), copper (Cu), gold (Au), iron (Fe), nickel (Ni), silver (Ag), combinations thereof or alloys of two or more of the aforementioned metals. Typical examples of metalized transfer substrates include without limitation plastic or polymer materials having a metal such as those described hereabove disposed either continuously or discontinuously on their surface. The metallization of the material described hereabove may be done by an electrodeposition process, a high-vacuum coating process or by a sputtering process and may be continuous or discontinuous. Typically, the metal has a thickness between about 1 and about 100 nanometers. Alternatively, the transfer substrate may be a laminated structure consisting of two layers that are laminated together and optionally comprising a security element and/or metallization between the two layers.

The metalized photomask described herein may comprise a surface relief in the form of an embossed diffraction structure. The metalized photomask described herein may comprise demetalized one or more parts or areas in the form of indicia in negative writing (also referred in the art as clear text) or positive writing. The demetalized parts may be produced by processes known to those skilled in the art such as for example chemical etching, laser etching or washing methods.

According to another preferred embodiment, the photomask described herein consists of an irradiation diffusing photomask. The irradiation diffusing photomask described herein may be printed on the substrate by a printing process as described above for the printed UV-absorbing photomask; or alternatively, the irradiation diffusing photomask may be incorporated as a layer or as a material within the substrate during its manufacture. The irradiation diffusing photomask is made of an irradiation diffusing photomask composition comprising one or more irradiation diffusing materials and an optional binder.

The irradiation diffusing photomask is designed to exhibit an appropriate light diffusion of the electromagnetic radiation so as to hinder transmission or to limit transmission of electromagnetic radiation to a very low level so that the coating layer facing the photomask, i.e. masked area (see "A" areas in FIGS. 5A and 5B) is not hardened during the hardening step (step b1).

The irradiation diffusing photomask described herein comprises one or more irradiation diffusing materials, wherein said irradiation diffusing materials are preferably selected from the group consisting of organic pigments, inorganic pigments, fillers, polymer particles or nanoparticles and mixtures thereof. The irradiation diffusing materials are in particular selected from the group consisting of titan dioxide (e.g. rutile and anatase), zinc oxide, zinc sulfide, calcium carbonate; particles and nanoparticles made of $SiO_2$, silicon, PMMA, PET or polycarbonate; and mixtures thereof. Examples of materials useful as diffusing materials have been disclosed e.g. in US 2013/0229824 A1.

As known to those skilled in the art, ingredients comprised in a composition to be applied by a printing process onto a substrate and the physical properties of said composition are determined by the nature of the printing process used to transfer the composition to the substrate and by the nature of the hardening process used to solidify said composition.

According to another preferred embodiment, the photomask described herein consists of a UV-absorbing photomask, preferably a printed UV-absorbing photomask. The printed UV-absorbing photomask described herein is made of a UV-absorbing photomask composition comprising a binder and one or more UV-absorbing materials. The printed UV-absorbing photomask is obtained by printing the UV-absorbing photomask composition on the substrate described herein and hardening said composition.

The printed UV-absorbing photomasks described herein are prepared by applying the UV-absorbing photomask composition described herein to the substrate described herein by a printing process preferably selected from the group consisting of offset-printing processes, rotogravure printing processes, silkscreen printing processes, copperplate intaglio printing processes, letterpress printing processes, roller-coating processes, and ink-jet printing processes; more preferably offset-printing processes, silkscreen printing processes, copperplate intaglio printing processes, and ink-jet printing, and still more preferably offset-printing processes, silkscreen printing and ink-jet printing processes.

Offset printing is a method consisting of transferring an ink from a printing plate to a blanket and then applying the ink on an article or a substrate. In a conventional offset printing process, the printing plate is damped, usually with a water or fountain solution, before it is inked. In such a conventional process, water forms a film on the hydrophilic areas (i.e. the non-image areas) of the printing plate but contracts into tiny droplets on the water-repellent areas (i.e. the image areas). When an inked roller is passed over the damped printing plate, it is unable to ink the areas covered by the water film but it pushes aside the droplets on the water-repellant areas and these ink up. Dry offset printing, also referred in the art as offset letterpress or letterset printings, combines features of both letterpress and lithographic printing. In such a process, the image is raised—as in letterpress—but is offset on to a rubber blanket before printing onto the substrate.

Intaglio printing is referred in the art as engraved copperplate printing and engraved steel die printing). During intaglio printing processes, an engraved steel cylinder carrying a plate engraved with a pattern or image to be printed is supplied with ink of inking cylinder(s) (or chablon cylinder), each inking cylinder being inked in at least one corresponding color to form security features. Subsequent to the inking, any excess of ink on the on the surface of the intaglio printing plate is wiped off by a rotating wiping cylinder. The remaining ink in the engraving of the printing cylinder is transferred under pressure onto the substrate to be printed while the wiping cylinder is cleaned by a wiping solution. Other wiping techniques can also be used, such as paper wiping or tissue wiping ("calico"). Subsequently to the wiping steps, the inked intaglio plate is brought into contact with the substrate and the ink is transferred under pressure from the engravings of the intaglio printing plate onto the substrate to be printed forming a thick printing pattern on the substrate. One of the distinguishing features of the intaglio printing process is that the film thickness of the ink transferred to the substrate can be varied from a few micrometers to several tens of micrometers by using correspondingly shallow or respectively deep recesses of the intaglio printing plate. Intaglio relief resulting from the intaglio ink layer thickness is emphasized by the embossing of the substrate, said embossing being produced by the pressure during the ink transfer. In comparison with screen printing, rotogravure printing and flexography printing which require liquid inks, intaglio printing relies on greasy and pasty (highly viscous) inks, having a viscosity in the range of 5 to 40 Pa·s at 40° C. and 1000 $s^{-1}$. Intaglio printing is further described for example in The Printing ink manual, R. H. Leach and R. J. Pierce, Springer Edition, $5^{th}$ Edition, page 74 and in Optical Document Security, R. L. van Renesse, 2005, $3^{rd}$ Edition, pages 115-117.

Letterpress printing, also referred to as letterpress relief printing, is a method consisting of transferring an ink from a hard metal printing plate comprising raised elements, such as letters, numbers, symbols, lines or dots. The raised printing elements are coated with a layer of ink of constant thickness by the application of rollers. The ink is then transferred to an article or a substrate. The letterpress printing technique is used with printing systems such as book printing, flexographic printing and letterset.

Ink-jet printing is a method consisting of propelling droplets of an ink onto a substrate. Ink-jet printing is computer-controlled and thus allows a large variety of flexible designs of the printed pattern. Ink-jet printing methods are divided in Continuous Ink-jet (CID) and Drop-on-Demand (DOD) methods. DOD methods are further divided in thermal and piezoelectric DOD. In thermal DOD inkjet method, thermal excitation is used to move small drops of ink and eject them through some cartridge nozzles of an ink reservoir. The ink reservoir, called cartridge, consists of a series of small chambers, each containing a heater. To eject a droplet from each chamber, a pulse of current is passed through the heating element causing a rapid vaporization of the ink in the chamber and forming a bubble, which causes a large pressure increase, propelling a droplet of ink onto the substrate The ink's surface tension, as well as the condensation and resultant contraction of the vapor bubble, pulls a further charge of ink into the chamber through a narrow channel attached to an ink reservoir. In thermal piezoelectric inkjet method, a voltage is applied to a piezoelectric material that changes shape, generating a pressure pulse in the ink fluid, which forces a droplet of ink from the nozzle.

Depending on the hardening process to produce the printed UV-absorbing photomask described herein, the UV-absorbing photomask composition may be a radiation curable composition, a thermal drying composition, an oxidatively drying composition or any combination thereof.

The printed UV-absorbing photomask is designed to exhibit an appropriate coverage and light absorption of the electromagnetic radiation so as to hinder transmission or to limit transmission of electromagnetic radiation to a very low level so that that the coating layer facing the photomask, i.e. masked area (see "A" areas in FIGS. 5A and 5B) is not hardened during the hardening step (step b1)). Coverage may be represented by the weight per unit area of the one or more UV-absorbing materials of the printed UV-absorbing photomask. For example, a thick printed UV-absorbing photomask with a low concentration of the one or more UV-absorbing materials can be similar in weight per unit area as a thin printed UV-absorbing photomask with a high concentration of the one or more UV-absorbing materials according to the Lambert-Beer law. Typically the printed UV-absorbing photomask has a thickness in a range from about 0.1 to about 500 micrometers, preferably from about 1 to about 100 micrometers, and more preferably from about 2 to about 20 micrometers.

The printed UV-absorbing photomask composition described herein comprises one or more UV-absorbing materials, wherein said materials preferably absorb in the range from about 200 nm to about 500 nm. The one or more UV-absorbing materials described herein are preferably selected from the group consisting of dyes, organic pigments, inorganic pigments, optically variable pigments, fillers, UV-absorbers (UVA, also known in the art as UV-light stabilizers for organic materials), mineral oxides nanoparticles and mixtures thereof.

Suitable dyes useful for the present invention are selected from the group comprising reactive dyes, direct dyes, anionic dyes, cationic dyes, acid dyes, basic dyes, food dyes, metal-complex dyes, solvent dyes and mixtures thereof. Typical examples of suitable dyes include without limitation coumarines, cyanines, oxazines, uranines, phtalocyanines, indolinocyanines, triphenylmethanes, naphtalocyanines, indonanaphtalo-metal dyes, anthraquinones, anthrapyridones, azo dyes, rhodamines, squarilium dyes, croconium dyes. Typical examples of dyes suitable for the present invention include without limitation C.I. Acid Yellow 1, 3, 5, 7, 11, 17, 19, 23, 25, 29, 36, 38, 40, 42, 44, 49, 54, 59, 61, 70, 72, 73, 75, 76, 78, 79, 98, 99, 110, 111, 121, 127, 131, 135, 142, 157, 162, 164, 165, 194, 204, 236, 245; C.I. Direct Yellow 1, 8, 11, 12, 24, 26, 27, 33, 39, 44, 50, 58, 85, 86, 87, 88, 89, 98, 106, 107, 110, 132, 142, 144; C.I. Basic Yellow 13, 28, 65; C.I. Reactive Yellow 1, 2, 3, 4, 6, 7, 11, 12, 13, 14, 15, 16, 17, 18, 22, 23, 24, 25, 26, 27, 37, 42; C.I. Food Yellow 3, 4; C.I. Acid Orange 1, 3, 7, 10, 20, 76, 142, 144; C.I. Basic Orange 1, 2, 59; C.I. Food Orange 2; C.I. Orange B; C.I. Acid Red 1, 4, 6, 8, 9, 13, 14, 18, 26, 27, 32, 35, 37, 42, 51, 52, 57, 73, 75, 77, 80, 82, 85, 87, 88, 89, 92, 94, 97, 106, 111, 114, 115, 117, 118, 119, 129, 130, 131, 133, 134, 138, 143, 145, 154, 155, 158, 168, 180, 183, 184, 186, 194, 198, 209, 211, 215, 219, 221, 249, 252, 254, 262, 265, 274, 282, 289, 303, 317, 320, 321, 322, 357, 359; C.I. Basic Red 1, 2, 14, 28; C.I. Direct Red 1, 2, 4, 9, 11, 13, 17, 20, 23, 24, 28, 31, 33, 37, 39, 44, 46, 62, 63, 75, 79, 80, 81, 83, 84, 89, 95, 99, 113, 197, 201, 218, 220, 224, 225, 226, 227, 228, 229, 230, 231, 253; C.I. Reactive Red 1, 2, 3, 4, 5, 6, 7, 8, 11, 12, 13, 15, 16, 17, 19, 20, 21, 22, 23, 24, 28, 29, 31, 32, 33, 34, 35, 36, 37, 38, 39, 40, 41, 42, 43, 45, 46, 49, 50, 58, 59, 63, 64, 108, 180; C.I. Food Red 1, 7, 9, 14; C.I. Acid Blue 1, 7, 9, 15, 20, 22, 23, 25, 27, 29, 40, 41, 43, 45, 54, 59, 60, 62, 72, 74, 78, 80, 82, 83, 90, 92, 93, 100, 102, 103, 104, 112, 113, 117, 120, 126, 127, 129, 130, 131, 138, 140, 142, 143, 151, 154, 158, 161, 166, 167, 168, 170, 171, 182, 183, 184, 187, 192, 193, 199, 203, 204, 205, 229, 234, 236, 249, 254, 285; C.I. Basic Blue 1, 3, 5, 7, 8, 9, 11, 55, 81; C.I. Direct Blue 1, 2, 6, 15, 22, 25, 41, 71, 76, 77, 78, 80, 86, 87, 90, 98, 106, 108, 120, 123, 158, 160, 163, 165, 168, 192, 193, 194, 195, 196, 199, 200, 201, 202, 203, 207, 225, 226, 236, 237, 246, 248, 249; C.I. Reactive Blue 1, 2, 3, 4, 5, 7, 8, 9, 13, 14, 15, 17, 18, 19, 20, 21, 25, 26, 27, 28, 29, 31, 32, 33, 34, 37, 38, 39, 40, 41, 43, 44, 46, 77; C.I. Food Blue 1, 2; C.I. Acid Green 1, 3, 5, 16, 26, 104; C.I. Basic Green 1, 4; 0.1: Food Green 3; C.I. Acid Violet 9, 17, 90, 102, 121; C.I. Basic Violet 2, 3, 10, 11, 21; C.I. Acid Brown 101, 103, 165, 266, 268, 355, 357, 365, 384; C.I. Basic Brown 1; C.I. Acid Black 1, 2, 7, 24, 26, 29, 31, 48, 50, 51, 52, 58, 60, 62, 63, 64, 67, 72, 76, 77, 94, 107, 108, 109, 110, 112, 115, 118, 119, 121, 122, 131, 132, 139, 140, 155, 156, 157, 158, 159, 191, 194; C.I. Direct Black 17, 19, 22, 32, 39, 51, 56, 62, 71, 74, 77, 94, 105, 106, 107, 108, 112, 113, 117, 118, 132, 133, 146, 154, 168; C.I. Reactive Black 1, 3, 4, 5, 6, 8, 9, 10, 12, 13, 14, 18, 31; C.I. Food Black 2; C.I. Solvent Yellow 19, C.I. Solvent Orange 45, C.I. Solvent Red 8, C.I. Solvent Green 7, C.I. Solvent Blue 7, C.I. Solvent Black 7; C.I. Disperse Yellow 3, C.I. Disperse Red 4, 60, C.I. Disperse Blue 3, and metal azo dyes disclosed in U.S. Pat. No. 5,074,914, U.S. Pat. No. 5,997,622, U.S. Pat. No. 6,001,161, JP 02-080470, JP 62-190272, JP 63-218766.

Suitable pigments for the present invention are selected from the group comprising organic pigments, inorganic pigments and mixtures thereof. Typical examples of pigments suitable for the present invention include without limitation C.I. Pigment Yellow 12, C.I. Pigment Yellow 42, C.I. Pigment Yellow 93, 109, C.I. Pigment Yellow 110, C.I. Pigment Yellow 147, C.I. Pigment Yellow 173, C.I. Pigment Orange 34, C.I. Pigment Orange 48, C.I. Pigment Orange 49, C.I. Pigment Orange 61, C.I. Pigment Orange 71 C.I. Pigment Orange 73, C.I. Pigment Red 9, C.I. Pigment Red 22, C.I. Pigment Red 23, C.I. Pigment Red 67, C.I. Pigment Red 122, C.I. Pigment Red 144, C.I. Pigment Red 146, C.I. Pigment Red 170, C.I. Pigment Red 177, C.I. Pigment Red 179, C.I. Pigment Red 185, C.I. Pigment Red 202, C.I. Pigment Red 224, C.I. Pigment Red 242, C.I. Pigment Red 254, C.I. Pigment Red 264, C.I. Pigment Brown 23, C.I. Pigment Blue 15, C.I. Pigment Blue 15:3, C.I. Pigment Blue 60, C.I. Pigment Violet 19, C.I. Pigment Violet 23, C.I. Pigment Violet 32, C.I. Pigment Violet 37, C.I. Pigment Green 7, C.I. Pigment Green 36, C.I. Pigment Black 7, C.I. Pigment Black 11, C. I. Pigment White 4, 0.1 Pigment White 6, C.I. Pigment White 7, C.I. Pigment White 21, C. I. Pigment White 22, antimony yellow, lead chromate, lead chromate sulfate, lead molybdate, ultramarine blue, cobalt blue, manganese blue, chrome oxide green, hydrated chrome oxide green, cobalt green and metal sulfides, such as cerium or cadmium sulfide, cadmium sulfoselenides, zinc ferrite, bismuth vanadate, Prussian blue, $Fe_3O_4$, carbon black, mixed metal oxides, azo, azomethine, methine, anthraquinone, phthalocyanine, perinone, perylene, diketopyrrolopyrrole, thioindigo, thiazinindigo, dioxazine, iminoisoindoline, iminoisoindolinone, quinacridone, flavanthrone, indanthrone, anthrapyrimidine and quinophthalone pigments, as well as mixtures, solid solutions and mixed crystals thereof.

When present, the UV-absorbing dyes, UV-absorbing organic pigments, UV-absorbing inorganic pigments or mixtures thereof described herein are preferably present in an amount suitable to produce photomask having an optical density $D_M$ calculated as described hereabove equal to or higher than about 1.0, preferably equal to or higher than about 1.1 and more preferable equal to or higher than about 1.2.in the range from 200 nm to 500 nm. When present, the UV-absorbing dyes, UV-absorbing organic pigments, UV-absorbing inorganic pigments or mixtures thereof described herein are preferably present in an amount from about 1 to about 80 wt-%, more preferably from about 10 to about 60 wt-% and still more preferably from about 10 to about 20 wt-%, the weight percents being based on the total weight of the UV-absorbing photomask composition.

Suitable UV-Absorbers (UVAs) for the present invention are selected from the group consisting of hydroxyphenylbenztriazole, benzophenone, benzoxazone, α-cyanoacrylate, oxanilide, tris-aryl-s-triazine, formamidine, cinnamate, malonate, benzilidene, salicylate, benzoate UVA's and mixtures thereof. The UVAs described herein are preferably present in an amount from about 0.5 to about 60 wt-%, more preferably from about 1 to about 30 wt-% and still more preferably from about 1 to about 10 wt-%, the weight percents being based on the total weight of the UV-absorbing photomask composition. Examples of UVAs have been disclosed e.g. in WO 02/28854A1, EP 1 844 049 B1, EP 0 717 313, WO 2004/099302 A1 (EP 1 620 500 B1), WO 2008/00646 A1 (EP 2 032 577 B1), WO 2006/131466 A1 (EP 1 888 539 B1), U.S. Pat. Nos. 5,354,794, 5,476,937, 5,556,973 and WO 2008/049755 A2.

Suitable mineral oxides nanoparticles for the present invention are selected from the group consisting of metal oxides nanoparticles. Typical examples of metal oxides nanoparticles suitable for the present invention include without limitation titanium dioxide, zinc oxide, cerium dioxide, copper oxide. Examples of metal oxides nanoparticles have been disclosed e.g. in US 2008/0031832 A1, US 2011/0245392 A1, U.S. Pat. No. 8,546,484 B2.

According to one aspect of the present invention, the UV-absorbing photomask composition described herein consists of an oxidatively drying composition. Oxidatively drying compositions dry by oxidation in the presence of oxygen, in particular in the presence of the oxygen of the atmosphere). During the drying process, the oxygen combines with one or more components of the composition, converting it to a semi-solid or a solid state. The drying process may be accelerated by the use of one or more catalysts or driers such as metallic salts and/or by the application of a thermal treatment. Typical examples of driers include without limitation inorganic or organic salts of metal(s), metallic soaps of organic acids, metal complexes and metal complex salts. Known driers comprise metals such e.g. cobalt, copper, manganese, cerium, zirconium, barium, strontium, lithium, bismuth, calcium, vanadium, zinc, iron and mixtures thereof. In particular, cobalt salts are widely used as driers for inks and coatings due to their high oxidative efficiency and their robustness, i.e. their efficiency remains high independently of the coating compositions. When present, the one or more driers are preferably present in an amount from about 0.001 to about 10 wt-%, the weight percents being based on the total weight of the oxidatively drying composition. Oxidatively drying compositions typically comprise at least one oxidatively drying varnish. Oxidatively drying varnishes are typically polymers comprising unsaturated fatty acid residues, saturated fatty acids residues or mixtures thereof, as generally known in the art. Saturated and unsaturated fatty acid compounds may be obtained from natural and/or artificial sources. Preferably the oxidatively drying varnishes described herein comprise unsaturated fatty acid residues to ensure the air drying properties. Suitable fatty acids are ethylenically unsaturated conjugated or non-conjugated C2-C24 carboxylic acids, such as myristoleic, palmitoleic, arachidonic, erucic, gadoleic, clupanadonic, oleic, ricinoleic, linoleic, linolenic, licanic, nisinic acid and eleostearic acids or mixtures thereof. Those fatty acids are typically used in the form of mixtures of fatty acids derived from natural or synthetic oils. Particularly preferred oxidatively drying varnishes are resins comprising unsaturated acid groups, even more preferred are resins comprising unsaturated carboxylic acid groups. However the resins may also comprise saturated fatty acids residues. Preferably the oxidatively drying varnishes described herein comprise acid groups, i.e. the oxidatively drying varnishes are selected among acid modified resins. The oxidatively drying varnishes described herein may be selected from the group consisting of alkyd resins, vinyl polymers, polyurethane resins, hyperbranched resins, rosin-modified maleic resins, rosin-modified phenol resins, rosin ester, petroleum resin-modified rosin ester, petroleum resin-modified alkyd resin, alkyd resin-modified rosin/phenol resin, alkyd resin-modified rosin ester, acrylic-modified rosin/phenol resin, acrylic-modified rosin ester, urethane-modified rosin/phenol resin, urethane-modified rosin ester, urethane-modified alkyd resin, epoxy-modified rosin/phenol resin, epoxy-modified alkyd resin, terpene resins nitrocellulose resins, polyolefins, polyamides, acrylic resins and combinations or mixtures thereof. Polymers and resins are herein interchangeably used.

According to one aspect of the present invention, the UV-absorbing photomask composition described herein consists of a thermal drying composition. Thermal drying compositions consist of compositions of any type of aqueous compositions or solvent-based compositions which are dried by hot air, infrared or by a combination of hot air and infrared. Typical examples of thermal drying compositions comprise components including without limitation resins such as polyester resins, polyether resins, vinyl chloride polymers and vinyl chloride based copolymers, nitrocellulose resins, cellulose acetobutyrate or acetopropionate resins, maleic resins, polyamides, polyolefins, polyurethane resins, functionalized polyurethane resins (e.g. carboxylated polyurethane resins), polyurethane alkyd resins, polyurethane-(meth)acrylate resins, urethane-(meth)acrylic resins, styrene (meth)acrylate resins or mixtures thereof. The term "(meth)acrylate" or "(meth)acrylic" in the context of the present invention refers to the acrylate as well as the corresponding methacrylate or refers to the acrylic as well as the corresponding methacrylic. As used herein, the term "solvent-based compositions" refers to compositions whose liquid medium or carrier substantially consists of one or more organic solvents. Examples of such solvents include without limitation alcohols (such as for example methanol, ethanol, isopropanol, n-propanol, ethoxy propanol, n-butanol, sec-butanol, tert-butanol, iso-butanol, 2-ethylhexyl-alcohol and mixtures thereof); polyols (such as for example glycerol, 1,5-pentanediol, 1,2,6-hexanetriol and mixtures thereof); esters (such as for example ethyl acetate, n-propyl acetate, n-butyl acetate and mixtures thereof); carbonates (such as for example dimethyl carbonate, diethylcarbonate, di-n-butylcarbonate, 1,2-ethylencarbonate, 1,2-propylencarbonate, 1,3-propylencarbonate and mixtures thereof); aromatic solvents (such as for example toluene, xylene and mixtures thereof); ketones and ketone alcohols (such as for example acetone, methyl ethyl ketone, methyl isobutyl ketone, cyclohexanone, diacetone alcohol and mixtures thereof); amides (such as for example dimethylformamide, dimethyl-acetamide and mixtures thereof); aliphatic or cycloaliphatic hydrocarbons; chlorinated hydrocarbons (such as for example dichloromethane); nitrogen-containing heterocyclic compound (such as for example N-methyl-2-pyrrolidone, 1,3-dimethyl-2-imidazolidone and mixtures thereof); ethers (such as for example diethyl ether, tetrahydrofuran, dioxane and mixtures thereof); alkyl ethers of a polyhydric alcohol (such as for example 2-methoxyethanol, 1-methoxypropan-2-ol and mixtures thereof); alkylene glycols, alkylene thioglycols, polyalkylene glycols or polyalkylene thioglycols (such for example ethylene glycol, polyethylene glycol (such as for example diethylene glycol, triethylene glycol, tetraethylene glycol), propylene glycol, polypropylene glycol (such as for example dipropylene glycol, tripropylene glycol), butylene glycol, thiodiglycol, hexylene glycol and mixtures thereof); nitriles (such as for example acetonitrile, propionitrile and mixtures thereof), and sulfur-containing compounds (such as for example dimethylsulfoxide, sulfolan and mixtures thereof). Preferably, the one or more organic solvents are selected from the group consisting of alcohols, esters and mixtures thereof.

According to one aspect of the present invention, the UV-absorbing photomask composition described herein consists of a radiation curable composition such as those described herein for the radiation curable coating composition.

Alternatively, the UV-absorbing photomask composition described herein may be dual-cure compositions combining thermal drying and radiation curing mechanisms. Typically, such compositions are similar to radiation curing compositions but include a volatile part constituted by water or by solvent. These volatile constituents are evaporated first using hot air or IR driers, and UV drying is then completing the hardening process.

The UV-absorbing photomask composition described herein may further comprise one or more additives including without limitation compounds and materials which are used for adjusting physical, rheological and chemical parameters of the composition such as the viscosity (e.g. solvents and surfactants), the consistency (e.g. anti-settling agents, fillers and plasticizers), the foaming properties (e.g. antifoaming agents), the lubricating properties (waxes), UV stability (photosensitizers and photostabilizers) and adhesion properties, etc. Additives described herein may be present in the printed UV-absorbing photomask composition disclosed herein in amounts and in forms known in the art, including in the form of so-called nano-materials where at least one of the dimensions of the particles is in the range of 1 to 1000 nm.

The UV-absorbing photomask composition described herein may further comprise one or more fillers such as those described herein for the radiation curable coating composition.

The UV-absorbing photomask compositions described herein may be prepared by dispersing or mixing the UV-absorbing material described herein, and the one or more additives when present in the presence of the binder described herein. When present, the one or more photoinitiators may be added to the composition either during the dispersing or mixing step of all other ingredients or may be added at a later stage.

The present invention provides a process for producing an optical effect layer (OEL) comprising a motif made of at least two areas, preferably at least two adjacent areas, made of a single hardened layer and wherein the at least two areas have a different magnetic or magnetizable pigment particles orientation pattern. One area of the at least two areas comprises a plurality of magnetic or magnetizable pigment particles oriented so as to follow a first magnetic or magnetizable pigment particles orientation pattern, said orientation pattern may be a random orientation or any orientation except a random orientation. Accordingly, the process described herein may (for any orientation except a random orientation) or may not require (for random orientation) the presence of a step (step b0)) of exposing one or more first substrate areas carrying the coating layer to the magnetic field of a first magnetic-field-generating device thereby orienting the plurality of magnetic or magnetizable pigment particles. Depending on the desired magnetic or magnetizable pigment particles orientation pattern, said first magnetic-field-generating device may be located on the side of the substrate carrying the coating layer, may be located on the opposite side, may be located on both sides or may be located beside the substrate. Preferably, and as shown in FIG. 5A-C, said magnetic-field-generating device is located on the side of the substrate carrying the coating layer thereby orienting the plurality of magnetic or magnetizable pigment particles so as to follow a concave curvature when viewed from the side carrying the coating layer, in particular a positive rolling bar feature.

FIG. 5A illustrates an example of a step of a process suitable for producing an OEL according to one aspect of the present invention. The substrate (530) described herein, which may be disposed on an optional supporting plate (550), comprises a photomask (580) such as those described herein applied on one or more areas of the surface of the substrate (530), and a coating layer (510) comprising a plurality of magnetic or magnetizable pigment particles such as those described herein. The coating layer is obtained by applying, preferably by a printing process such as those described herein, the radiation curable coating composition described herein on the same side of the substrate as the photomask (580), such that the photomask faces the substrate (530) and the coating layer (510). The radiation curable coating composition may be applied, preferably by a printing process such as those described herein, in register with the photomask (580); however, the radiation curable coating composition is preferably applied, preferably by a printing process such as those described herein, over one or more areas of the substrate (530) that are more extended than the photomask (580). The photomask (580) may be completely or partially covered by the coating layer (510), meaning that the one or more areas of the substrate (530) comprising the photomask (580) may extend outside of the one or more areas comprising the coating layer (510). In FIG. 5A, the photomask (580) is only partially covered by the coating layer (510).

FIG. 5B illustrates an example of a step of a process suitable for producing an OEL according to one aspect of the present invention. The substrate (530) described herein which is disposed on an optional supporting plate (550), comprises a photomask (580) such as those described herein applied on at least one of the surface of the substrate (530), and a coating layer (510) comprising a plurality of magnetic or magnetizable pigment particles such as those described herein. The coating layer is obtained by applying, preferably by a printing process such as those described herein, the radiation curable coating composition described herein on the opposite side of the substrate as the photomask (580), such that the photomask (580) and the coating layer (510) face the environment, each one on one side of the substrate (530). The radiation curable coating composition may be applied, preferably by a printing process such as those described herein, in register with the photomask (580); however, the radiation curable coating composition is preferably applied, preferably by a printing process such as those described herein, over one or more areas of the substrate (530) that are more extended than the photomask (580). The photomask (580) may be present only in one or more areas of the substrate (530) facing one or more areas comprising the coating layer (510), or alternatively, the photomask (580) may be present in one or more areas which are not faced by one or more areas comprising the coating layer (510) as illustrated in FIG. 5B.

Figure 6A:
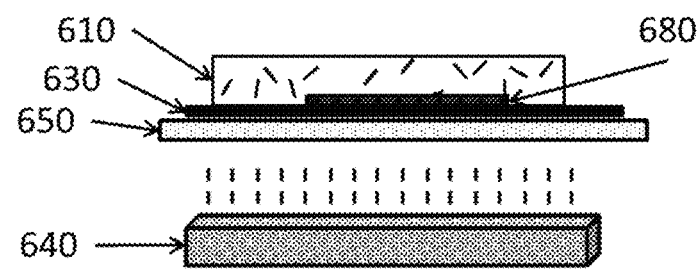
FIG. 6A-B schematically illustrates an example of a process for producing an optical effect layer on a substrate (630), wherein the substrate comprises a coating layer (610) and a photomask (680) present on the surface facing the coating layer (610), wherein the coating layer (610) is on top of the photomask (680); the optical effect layer being produced by using in a first step (FIG. 6A) a UV-Vis irradiation source (640) for hardening the coating layer (610) by irradiation through the substrate (630) and the photomask (680), and by using in a second step (FIG. 6B) a magnetic device (671) generating a convex magnetic field and a UV-Vis irradiation source disposed on the side of the substrate carrying the coating layer (610) for a simultaneous or partially simultaneous hardening.
Figure 6B:
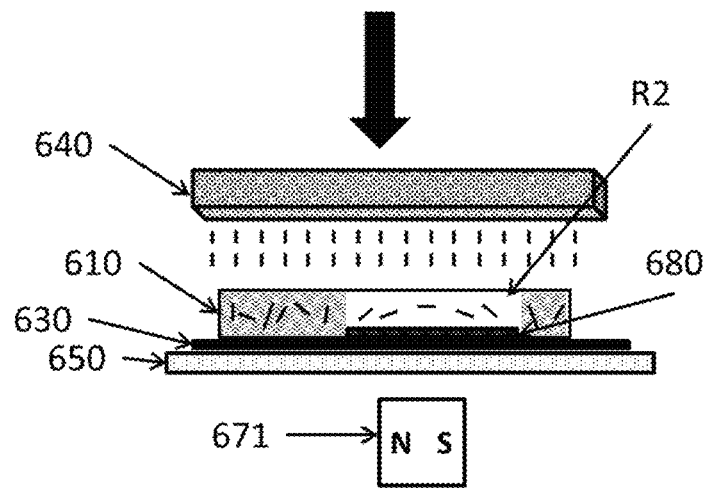

FIG. 6A-B illustrate an example of a process suitable for producing an OEL according to the present invention. The substrate (630) described herein, which may be disposed on an optional supporting plate (650), comprises a photomask (680) such as those described herein applied on one or more areas of the surface of the substrate (630), and a coating layer (610) comprising a plurality of magnetic or magnetizable pigment particles such as those described herein. The coating layer is obtained by applying, preferably by a printing process such as those described herein, the radiation curable coating composition described herein on the same side of the substrate as the photomask (680), such that the photomask faces the substrate (630) and the coating layer (610). The radiation curable coating composition may be applied, preferably by a printing process such as those described herein, in register with the photomask (680); however, the radiation curable coating composition is preferably applied, preferably by a printing process such as those described herein, over one or more areas of the substrate (630) that are more extended than the photomask (680). The photomask (680) may be completely or partially covered by the coating layer (610), meaning that the one or more areas of the substrate (630) comprising the photomask (680) may extend outside of the one or more areas comprising the coating layer (610). In FIG. 6A, the photomask (680) is completely covered by the coating layer (610).

In a first step (FIG. 6A), the coating layer (610) is hardened (step b1)) to a second state so as to fix/freeze the magnetic or magnetizable pigment particles in their random positions and orientations, said hardening step (step b1)) being performed by irradiation with a UV-Vis irradiation source located on the side of the substrate.

In a second step (FIG. 6B), the coating layer (610) is exposed to the magnetic field of a magnetic-field-generating device described herein (step c1)), the coating layer described herein is simultaneously, partially simultaneously or subsequently hardened (step c2)) to a second state so as to fix/freeze the magnetic or magnetizable pigment particles in their adopted positions and orientations, said hardening step (step c2)) being performed by irradiation with a UV-Vis irradiation source located on the side of the coating layer (610), that is so as to fix/freeze the magnetic or magnetizable pigment particles in the areas of the coating layer (610) not facing the photomask (680) in their adopted positions and orientations (R2). In the example shown in FIG. 6 A-B, the magnetic or magnetizable pigment particles in the areas of the coating layer (610) not facing the photomask (680) follows a convex curvature; however the magnetic-field-generating device (671) may be selected and positioned so as to produce any non-random orientation.

Figure 7A:
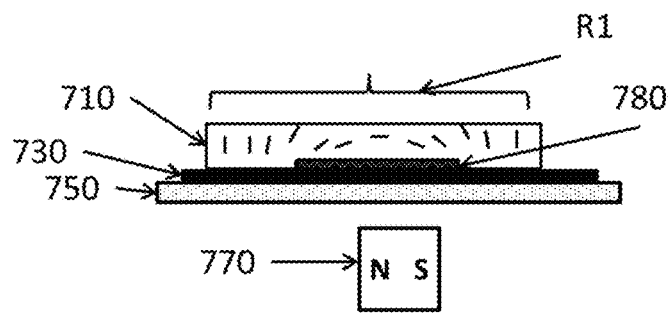
FIG. 7A-C schematically illustrates an example of a process for producing an optical effect layer on a substrate (730), wherein the substrate comprises a coating layer (710) and a photomask (780) present on the surface facing the coating layer (710), wherein the coating layer (710) is on top of the photomask (780); the optical effect layer being produced by using in a first step (FIG. 7A), a first magnetic device (770) generating a first magnetic field, a UV-Vis irradiation source (740) for simultaneously, partially simultaneously or subsequently hardening the coating layer (710) by irradiation through the substrate (730) and the photomask (780) (FIG. 7B), and by using a second magnetic device (771) (FIG. 7C) generating a second magnetic field and a UV-Vis irradiation source disposed on the side of the substrate carrying the coating layer (710) for a simultaneous, partially simultaneous or subsequently hardening the coating layer (710).
Figure 7B:
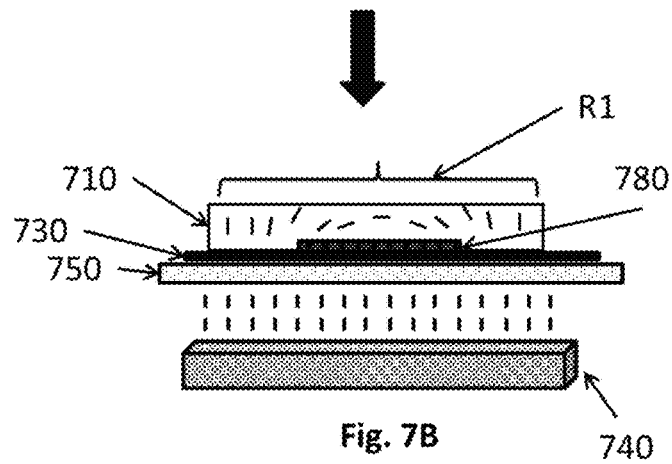
Figure 7C:
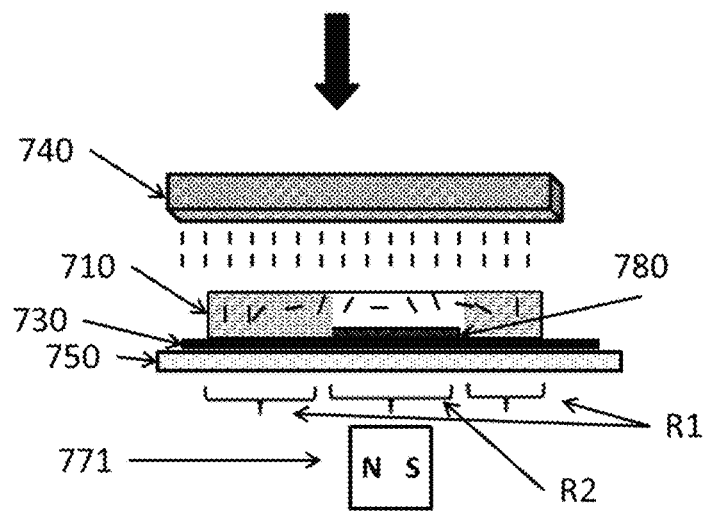

FIG. 7A-C illustrate another example of a process suitable for producing an OEL according to another aspect of the present invention. The substrate (730) described herein, which may be disposed on an optional supporting plate (750), comprises a photomask (780) such as those described herein applied on the surface of the substrate (730), and a coating layer (710) comprising a plurality of magnetic or magnetizable pigment particles such as those described herein. The substrate (730) comprising the coating layer (710) and the photomask (780) is obtained in a similar manner to the substrate (630) described above.

In a first step (FIG. 7A-B), the coating layer (710) is exposed to the magnetic field of a first magnetic-field-generating device (770) described herein (step b0)), the coating layer described herein is simultaneously, partially simultaneously or subsequently hardened (step b1)) to a second state so as to fix/freeze the magnetic or magnetizable pigment particles in their adopted positions and orientations, said hardening step (step b1)) being performed by irradiation with a UV-Vis irradiation source (740) located on the side of the substrate (730), that is so as to fix/freeze the magnetic or magnetizable pigment particles in the areas of the coating layer (710) not facing the photomask (780) in their adopted positions and orientations (R1). In the example shown in FIG. 7A-B, the adopted positions and orientations (R1) follows a convex curvature; however the first magnetic-field-generating device may be selected and positioned so as to produce any non-random orientation.

In a second step (FIG. 7C), the coating layer (710) is exposed to the magnetic field of a second magnetic-field-generating device (771) described herein (step c1)), the coating layer described herein is simultaneously, partially simultaneously or subsequently hardened (step c2)) to a second state so as to fix/freeze the magnetic or magnetizable pigment particles in their adopted positions and orientations, said hardening step (step c2)) being performed by irradiation with a UV-Vis irradiation source (740) located on the side of the coating layer (710).

In the absence of the step of exposing one or more first substrate areas carrying the coating layer to the magnetic field of a first magnetic-field-generating device (step b0)), or simultaneously, partially simultaneously with or subsequently to the step b0), preferably simultaneously or partially simultaneously with step b0), the coating layer described herein is hardened (step b1) through the substrate to a second state so as to fix/freeze the magnetic or magnetizable pigment particles in their random or adopted positions and orientations, said hardening step (step b1)) being performed by irradiation with a UV-Vis irradiation source located on the side of the substrate. As shown in FIGS. 5A and 5B, 6A and 6B, 7A, 7B and 7C, only the one or more areas of the substrate lacking the photomask, i.e. masked area (see "B" in FIGS. 5A and 5B) are hardened during that step.

The preferred step of simultaneously or partially simultaneously hardening (step b1)) the coating layer and exposing the one or more first substrate areas carrying the coating layer to the magnetic field (step b0)) involves orienting the magnetic or magnetizable pigment particles by the magnetic field of the first magnetic-field-generating device. Put another way, the magnetic field of the first magnetic-field-generating device that is orienting the magnetic or magnetizable pigment particles in at least part of the coating layer overlaps in space and time with irradiation of the UV-Vis irradiation source, albeit preferably from opposed sides of the substrate.

Irradiation to harden the coating layer described herein (step b1)) is effected with light of a wavelength from about 200 nm to about 500 nm. A large number of widely varying types of radiations sources may be used. Point sources and also planiform radiators (lamp carpets are suitable). Examples thereof include without limitation carbon arc lamps, xenon arc lamps, medium-, high- and low-pressure mercury lamps, dopes where appropriate with metal halides (metal halides lamps), microwave-excited metal vapor lamps, excimer lamps, superactinid fluorescent tubes, fluorescent lamps, argon incandescent lamps, flashlamps, photographic flood lights and light emitting diodes (LED).

The process described herein further comprises a step c1) of exposing at least one or more second substrate areas carrying the coating layer which are in a first state due to the presence of the photomask to the magnetic field of a second magnetic-field-generating device thereby orienting the plurality of magnetic or magnetizable pigment particles so as to follow any orientation except a random orientation; and c2) simultaneously, partially simultaneously or subsequently hardening by irradiation with a UV-Vis irradiation source at least the one or more second substrate areas carrying the coating layer to a second state so as to fix/freeze the magnetic or magnetizable pigment particles in their adopted positions and orientations. Preferably, the step c2) of hardening by irradiation with a UV-Vis irradiation source at least the one or more second substrate areas carrying the coating is carried out simultaneously or partially simultaneously with the step c1) of exposing at least one or more second substrate areas to the magnetic field of the second magnetic-field-generating device. Irradiation to harden the coating layer described herein (step c2)) is effected as described hereabove for the step b1).

As mentioned hereabove, one of the at least two areas, preferably at least two adjacent areas, comprises a plurality of magnetic or magnetizable pigment particles that follows a random or any orientation except a random magnetic or magnetizable pigment particles orientation, preferably any magnetic or magnetizable pigment particles orientation except a random orientation, more preferably a concave curvature when viewed from the side carrying the coating layer, still more preferably a positive rolling bar feature, and the other of the at least two areas, preferably at least two adjacent areas, comprises a plurality of magnetic or magnetizable pigment particles that follows any magnetic or magnetizable pigment particles orientation except a random orientation, provided that the two magnetic or magnetizable pigment particles orientation patterns are different and distinguishable with naked eye. The desired magnetic or magnetizable pigment particles orientation pattern of the plurality of magnetic or magnetizable pigment particles of the other of said at least two areas, preferably at least two adjacent areas, is chosen according to the end-use applications. Examples of any pattern except a random orientation include without limitation rolling bar features, flip-flop effects (also referred in the art as switching effect), Venetian-blind effects, moving-ring effects. According to one embodiment, the plurality of magnetic or magnetizable pigment particles of the other of said at least two areas, preferably at least two adjacent areas, follows a convex curvature when viewed from the side carrying the OEL, in particular a negative rolling bar feature. Flip-flop effects include a first printed portion and a second printed portion separated by a transition, wherein pigment particles are aligned parallel to a first plane in the first portion and pigment particles in the second portion are aligned parallel to a second plane. Methods for producing flip-flop effects are disclosed for example in EP 1 819 525 B1 and EP 1 819 525 B1. Venetian-blind effects may also be produced. Venetian-blind effects include pigment particles being oriented such that, along a specific direction of observation, they give visibility to an underlying substrate surface, such that indicia or other features present on or in the substrate surface become apparent to the observer, while they impede the visibility along another direction of observation. Methods for producing Venetian-blind effects are disclosed for example in U.S. Pat. No. 8,025,952 and EP 1 819 525 B1. Moving-ring effects consists of optically illusive images of objects such as funnels, cones, bowls, circles, ellipses, and hemispheres that appear to move in any x-y direction depending upon the angle of tilt of said optical effect layer. Methods for producing moving-ring effects are disclosed for example in EP 1 710 756 A1, U.S. Pat. No. 8,343,615, EP 2 306 222 A1, EP 2 325 677 A2, WO 2011/092502 A2 and US 2013/084411. Moving loop-shaped effects consists of optically illusive images of objects such as circles, rectangles or square, triangles, pentagons, hexagons, heptagons, octagons etc. that appear to move in any x-y direction depending upon the angle of tilt of said optical effect layer. Methods for producing moving loop-shaped effects are disclosed for example in WO 2014/108404 A2 and WO 2014/108303 A1.

The plurality of magnetic or magnetizable pigment particles of the at least two patterns may also be produced by using a first and/or a second magnetic-field-generating device independently comprising a magnetic plate carrying surface one or more reliefs, engravings or cut-outs. WO 2005/002866 A1 and WO 2008/046702 A1 are examples for such engraved magnetic plates.

Depending on the desired magnetic or magnetizable pigment particles orientation patterns of the plurality of magnetic or magnetizable pigment particles and as known by the man skilled in the art, static or dynamic magnetic-field-generating devices may be used for the orientation of the magnetic or magnetizable pigment particles with the first and second magnetic-field-generating device, i.e. the first and/or second magnetic-field-generating device may be static devices or dynamic devices.

The step of hardening by irradiation with a UV-Vis irradiation source at least the one or more second substrate areas carrying the coating layer to a second state (step c2)) so as to fix/freeze the magnetic or magnetizable pigment particles in their adopted positions and orientations may be partially simultaneously, simultaneously or subsequently, preferably partially simultaneously or simultaneously, performed with the exposing the at least one or more second substrate areas to the magnetic field of a second magnetic-field-generating device thereby orienting the plurality of magnetic or magnetizable pigment particles so as to follow any orientation except a random orientation.

Figure 8A:
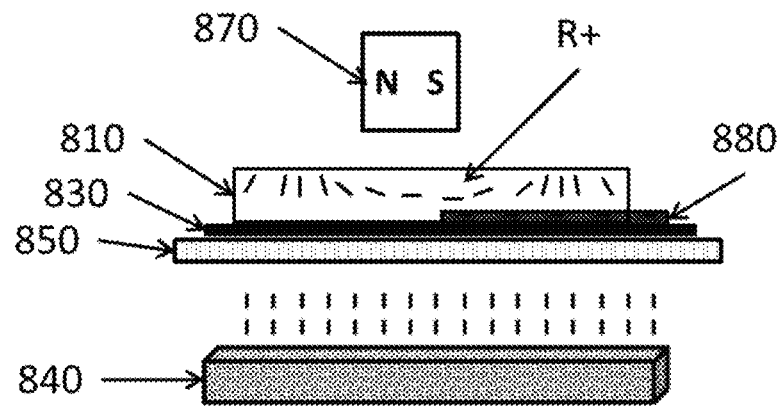
FIG. 8A-B schematically illustrates an example of a process for producing an optical effect layer on a substrate (830), wherein the substrate comprises a coating layer (810) and a photomask (880) present on the surface facing the coating layer (810), wherein the coating layer (810) is on top of the photomask (880); the optical effect layer being produced by using in a first step (FIG. 8A) a first magnetic device (870) generating a concave magnetic field, a UV-Vis irradiation source (840) for a simultaneous or partially simultaneous hardening, rotating the substrate by 90° in the plane of the substrate and turning it up-side-down, and by using in a second step (FIG. 8B) a second magnetic device (871) generating a convex magnetic field and a UV-Vis irradiation source disposed on the side of the substrate carrying the coating layer for simultaneous or partially simultaneous hardening.
Figure 8B:
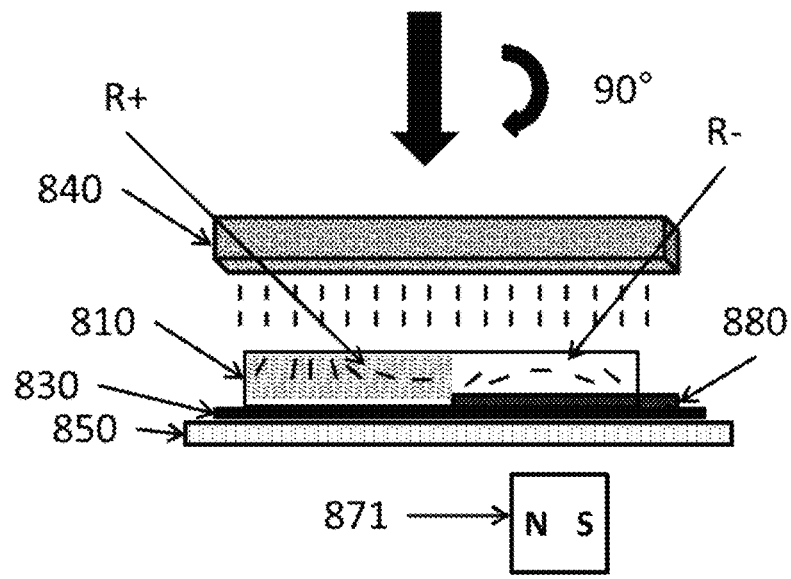

FIGS. 8A and 8B schematically illustrates an experiment performed to assess the efficiency of the photomask described herein. FIG. 8A illustrates a step consisting of the magnetic orientation of a plurality of magnetic or magnetizable pigment particles in a radiation curable coating composition such as those described herein and the simultaneous or partially simultaneous hardening by irradiation through the combination of the photomask and substrate of the coating layer obtained from the radiation curable coating composition. FIG. 8B illustrates a step of hardening of the coating layer that is carried out by irradiation from the side of the OEL comprising the coating layer.

In a first step (FIG. 8A), a radiation curable coating composition comprising the magnetic or magnetizable pigment particles such as those described herein is applied, preferably by a printing process such as those described herein, on a substrate (830) carrying a photomask (880) such as those described herein, preferably a printed UV-absorbing photomask, said radiation curable coating composition being applied partially on top of the photomask (880) so as to form a coating layer (810). The plurality of magnetic or magnetizable pigment particles described herein are oriented by using a first magnetic-field-generating device (870) disposed on the same side of the substrate as the coating layer (810) such that the plurality of magnetic or magnetizable pigment particles follow a concave curvature, in particular a positive rolling bar feature ($R^+$). The first magnetic-field-generating device may comprise a recess (not shown in FIG. 8A) such that the coating layer (810) is not in direct contact with the surface of the first magnetic-field-generating device (870). Simultaneously or partially simultaneously with the orientation of the pigment particles, the coating layer (810) is hardened by using an UV-Vis irradiation source (840) disposed on the side of the substrate not carrying the photomask (880) and the coating layer (810), i.e. the coating layer (810) is hardened through the substrate (830).

In a second step (FIG. 8B), the substrate is then rotated by 90° in the plane of the substrate. The coating layer (810) comprises magnetic or magnetizable pigment particles, wherein said coating layer comprises one or more substrate areas which are in the first state (wet and not yet hardened state) due to the presence of the photomask. The magnetic or magnetizable pigment particles in the one or more areas which are in the first state, i.e. the one or more areas of the coating layer facing the photomask (880), are oriented using a second magnetic-field-generating device (871) disposed on the opposite side of the substrate as the coating layer (810) so as to follow a convex curvature, in particular a negative rolling bar feature (R⁻). Simultaneously or partially simultaneously with the orientation of the pigment particles, the coating composition (810) is hardened by using an UV-Vis irradiation source (840) disposed on the same side of the substrate as the coating layer (810).

Figure 8C:
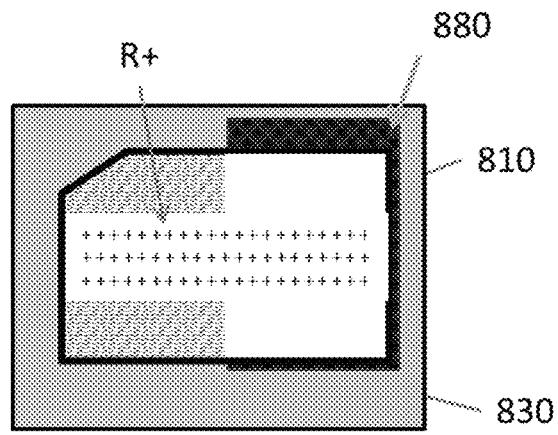
FIG. 8C schematically illustrates an OEL obtained by the process of FIG. 8A (first step).
Figures 1, 8D:
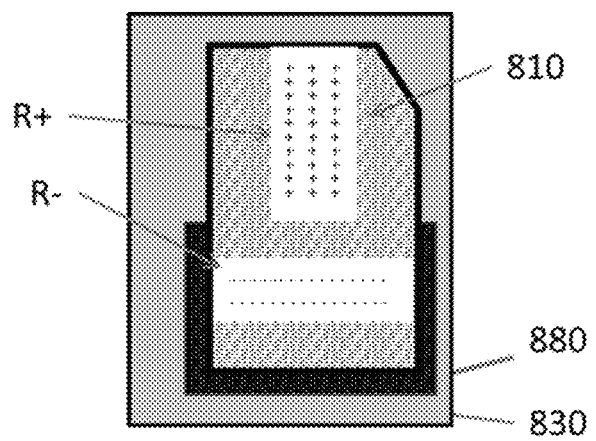
Figures 2, 8D:
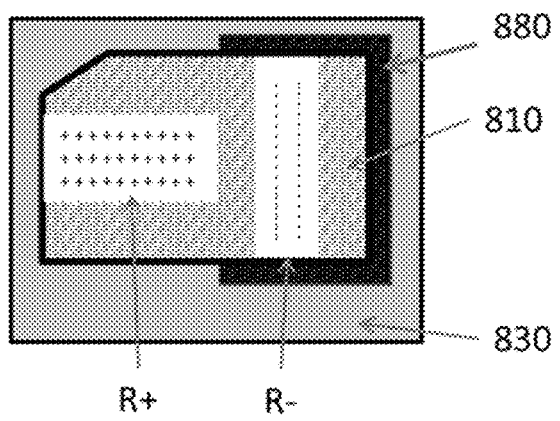

FIG. 8C illustrates the resulting OEL obtained after the first step of the process illustrated in FIG. 8A as seen by an observer located on the side of the substrate carrying the coating layer (810). FIG. 8D-1 illustrates the resulting OEL after the second step of the process illustrated in FIG. 8B as seen by an observer located on the side of the substrate carrying the coating layer. FIG. 8D-2 illustrates the same resulting OEL as seen by an observer located on the side of the substrate carrying the coating layer after a 90° rotation in the plane of the substrate.

FIGS. 9A-C, 10A-C, 11A-C, 12A-C and 13A-C show pictures of samples prepared according to the experiment of FIG. 8A-B. FIGS. 9A, 10A, 11A, 12A and 13A show OELs produced with a photomask suitable for the present invention, i.e. a photomask having an optical density $D_M$ equal to or higher than about 1.0, preferably equal to or higher than about 1.1 and more preferable equal to or higher than about 1.2. FIGS. 9B-C, 10B-C, 11B-C, 12B-C and 13B-C show OELs produced with photomasks that are not suitable for the present invention.

The present invention further provides optical effect layers (OELs) produced by the process according to the present invention.

The OEL described herein may be provided directly on a substrate on which it shall remain permanently (such as for banknote applications). Alternatively, an OEL may also be provided on a temporary substrate for production purposes, from which the OEL is subsequently removed. This may for example facilitate the production of the OEL, particularly while the binder material is still in its fluid state. Thereafter, after hardening the coating composition for the production of the OEL, the temporary substrate may be removed from the OEL.

Alternatively, an adhesive layer may be present on the OEL or may be present on the substrate comprising an optical effect layer (OEL), said adhesive layer being on the side of the substrate opposite the side where the OEL is provided or on the same side as the OEL and on top of the OEL. Therefore an adhesive layer may be applied to the optical effect layer (OEL) or to the substrate, said adhesive layer being applied after the hardening step has been completed. Such an article may be attached to all kinds of documents or other articles or items without printing or other processes involving machinery and rather high effort. Alternatively, the substrate described herein comprising the OEL described herein may be in the form of a transfer foil, which can be applied to a document or to an article in a separate transfer step. For this purpose, the substrate is provided with a release coating, on which the OEL are produced as described herein. One or more adhesive layers may be applied over the so produced OEL.

Also described herein are substrates comprising more than one, i.e. two, three, four, etc. optical effect layers (OEL) obtained by the process described herein.

Also described herein are articles, in particular security documents, decorative elements or objects, comprising the optical effect layer (OEL) produced according to the present invention. The articles, in particular security documents, decorative elements or objects, may comprise more than one (for example two, three, etc.) OELs produced according to the present invention.

As mentioned hereabove, the optical effect layer (OEL) produced according to the present invention may be used for decorative purposes as well as for protecting and authenticating a security document. Typical examples of decorative elements or objects include without limitation luxury goods, cosmetic packaging, automotive parts, electronic/electrical appliances, furniture and fingernail lacquers.

Security documents include without limitation value documents and value commercial goods. Typical example of value documents include without limitation banknotes, deeds, tickets, checks, vouchers, fiscal stamps and tax labels, agreements and the like, identity documents such as passports, identity cards, visas, driving licenses, bank cards, credit cards, transactions cards, access documents or cards, entrance tickets, public transportation tickets or titles and the like, preferably banknotes, identity documents, right-conferring documents, driving licenses and credit cards. The term "value commercial good" refers to packaging materials, in particular for cosmetic articles, nutraceutical articles, pharmaceutical articles, alcohols, tobacco articles, beverages or foodstuffs, electrical/electronic articles, fabrics or jewelry, i.e. articles that shall be protected against counterfeiting and/or illegal reproduction in order to warrant the content of the packaging like for instance genuine drugs. Examples of these packaging materials include without limitation labels, such as authentication brand labels, tamper evidence labels and seals. It is pointed out that the disclosed substrates, value documents and value commercial goods are given exclusively for exemplifying purposes, without restricting the scope of the invention.

Alternatively, the optical effect layer (OEL) may be produced onto an auxiliary substrate such as for example a security thread, security stripe, a foil, a decal, a window or a label and consequently transferred to a security document in a separate step.

The skilled person can envisage several modifications to the specific embodiments described above without departing from the spirit of the present invention. Such modifications are encompassed by the present invention.

Further, all documents referred to throughout this specification are hereby incorporated by reference in their entirety as set forth in full herein.

EXAMPLES

Description of the preparation of printed examples

OELs were produced on a substrate (a fiduciary standard paper BNP 90 g/m² from Papierfabrik Louisenthal) by the process illustrated in FIGS. 6A-B, 7A-C and 8A-B.

The UV-absorbing photomask compositions described in Tables 2 and 5 (offset), Tables 3 and 5 (solvent based silkscreen) and Tables 4 and 5 (UV-curable silkscreen) were respectively applied on the substrate in the amount described in Examples 1-2 and in Table 5. The UV-absorbing photomask compositions were applied as solid prints (about 20 cm×4 cm) on a printability tester from Prüfbau for the offset composition; or as rectangles (2.5×3.5 cm) for the silkscreen composition (with a T90 silkscreen screen), except for Example 1 wherein the UV-absorbing photomask was applied as a "50" indicium.

The absorption spectra of the combined photomask and substrate were measured with a Spectrophotometer Perkin Elmer Lambda 950 in a sphere integration mode. The emission spectrum of the irradiation source (UV-LED) was obtained from the lamp provider.

The optical density of the photomasks listed in Table 5 were calculated as described above using an integration interval from $\lambda_1=370$ nm to $\lambda_2=420$ nm.

Description of the Preparation of Example E1

TABLE 1

Radiation (UV-Vis) curable coating composition comprising a plurality of non-spherical magnetic or magnetizable pigment particles

| Ingredients | Wt-% |
|---|---|
| Epoxyacrylate oligomer | 28 |
| Trimethylolpropane triacrylate monomer | 19.5 |
| Tripropyleneglycol diacrylate monomer | 20 |
| Genorad 16 (Rahn) | 1 |
| Aerosil 200 (Evonik) | 1 |
| Speedcure TPO-L (Lambson) | 2 |
| Irgacure ® 500 (BASF) | 6 |
| Genocure ® EPD (Rahn) | 2 |
| BYK ®-371 (BYK) | 2 |
| Tego Foamex N (Evonik) | 2 |
| Non-spherical optically variable magnetic pigment particles (7 layers)(*) | 16.5 |
| Total | 100 |

(*)gold-to-green optically variable magnetic pigment particles having a flake shape of diameter $d_{50}$ about 9.3 μm and thickness about 1 μm, obtained from JDS-Uniphase, Santa Rosa, CA.

A substrate comprising a photomask (680) in the shape of a "50" indicium (FIG. 6C) and made of a solvent based silkscreen composition (see Table 3) containing 1.1 wt-% of C-black (Carbon Special Black 4A from Orion) was used. The photomask was applied with a T90 silkscreen (corresponding to a wet deposit of about 25 g/m²).

Figure 6C:
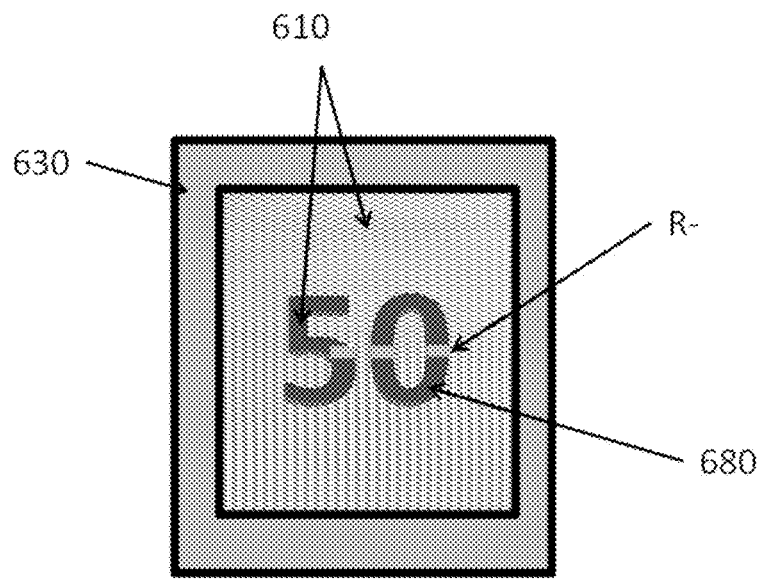
FIG. 6C-D schematically illustrates (FIG. 6C) and shows a picture (FIG. 6D) of an OEL obtained by the process of FIG. 6A-B.

A radiation (UV-Vis) curable coating composition comprising a plurality of non-spherical magnetic or magnetizable pigment particles described in Table 1 was applied on the same side of the substrate as the photomask by silkscreen printing so as to obtain a coating layer having the shape of a rectangle (about 2×2 cm) (610), as illustrated in FIGS. 6A and 6C.

The radiation (UV-Vis) curable coating composition (610) was hardened by UV-irradiation for 0.05 sec with a UV-Vis irradiation source (640) (UV-LED-lamp from Phoseon, Type FireFlex 50×75 mm, 395 nm, 8 W/cm²) disposed on the side of the substrate opposite to the side carrying the coating layer as illustrated in FIG. 6A, i.e. by irradiation through the substrate and the photomask.

A magnetic-field-generating device (671) consisting of a NdFeB permanent magnetic bar (L×I×H=6×18×30 mm) was disposed below the substrate (630) to orient the plurality of non-spherical magnetic or magnetizable pigment particles according to a convex (negative) curvature (R2) in the area wherein the coating layer (610) was not yet hardened due to the presence of the photomask, i.e. the area of the coating layer (610) facing the photomask (680), as illustrated in FIG. 6B. Partially simultaneously with the orientation of the pigment particles, the substrate was exposed to UV-irradiation for 0.2 sec with the UV-LED-lamp (640) disposed on the side of the substrate carrying the coating layer (610), as illustrated in FIG. 6B.

The resulting coated substrate carrying an OEL oriented according to a combination of randomly oriented pigment particles (in the area surrounding the "50" indicium) and a convex (negative) $R^-$ curvature (within the "50" indicium) is schematically represented in FIG. 6C.

Figure 6D:
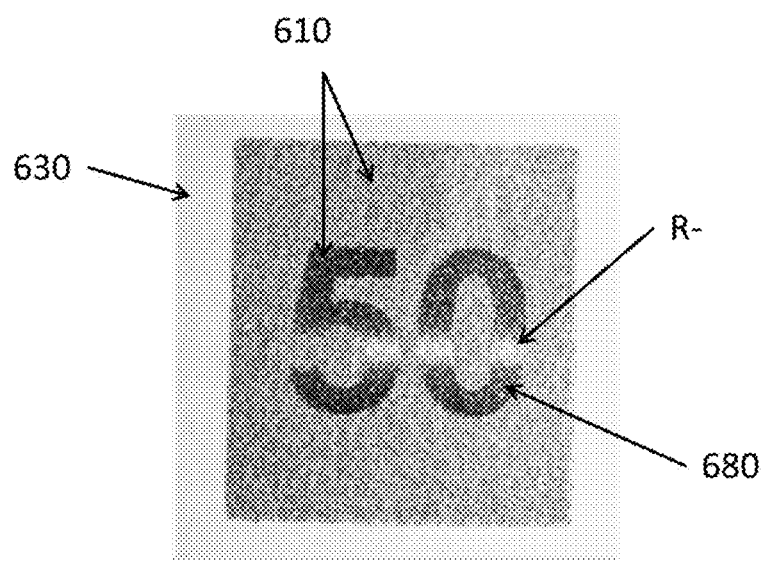

FIG. 6D shows a picture of the OEL prepared according to the process illustrated in FIGS. 6A and 6B and described in the example E1.

Description of the Preparation of Example E2

A substrate comprising a photomask (780) in the shape of a rectangle (FIG. 7A-D) and made of a solvent based silkscreen composition (see Table 3) containing 1.1% of C-black (Carbon Special Black 4A from Orion) was used. The photomask was applied with T90 silkscreen (corresponding to a wet deposit of about 25 g/m²).

A radiation (UV-Vis) curable coating composition (comprising a plurality of non-spherical magnetic or magnetizable pigment particles described in Table 1 was applied on the same side of the substrate as the photomask, by silkscreen printing so as to obtain a coating layer having the shape of a rectangle (about 2×2 cm) (710).

The substrate comprising the photomask and the coating layer described herein was disposed on a magnetic-field-generating device (770) (FIG. 7A) consisting of a NdFeB permanent magnetic bar (L×I×H=6×18×30 mm) used to orient the plurality of non-spherical magnetic or magnetizable pigments particles according to a convex (negative) curvature (R1). The magnetic-field-generating device (770) was disposed in a position in the center of the length of the substrate. Subsequently to the orientation of the pigment particles, the coating layer was hardened by exposing the substrate to UV-irradiation for 0.05 sec with the UV-LED-lamp (740) (UV-LED-lamp from Phoseon, Type FireFlex 50×75 mm, 395 nm, 8 W/cm²) disposed on the side of the substrate opposite to the side carrying the coating layer as illustrated in FIG. 7B, i.e. by irradiation through the substrate and the photomask.

In a second step (FIG. 7C), the substrate (730) was disposed on a magnetic-field-generating device (771) consisting of a NdFeB permanent magnetic bar (L×I×H=6×18×30 mm) to orient the plurality of non-spherical magnetic or magnetizable pigment particles according to a convex (negative) curvature (R2) in the area wherein coating layer (710) was not yet hardened due to the presence of the photomask, i.e. the area of the coating layer (710) facing the photomask (780), as illustrated in FIG. 7C. The magnetic-field-generating device (771) was disposed in a position out of the center of the length of the substrate. Partially simultaneously with the orientation of the pigment particles, the coating layer was hardened by exposing the substrate to UV-irradiation for 0.2 sec with the UV-LED-lamp (740) disposed on the side of the substrate carrying the coating layer (710), as illustrated in FIG. 7C.

Figure 7D:
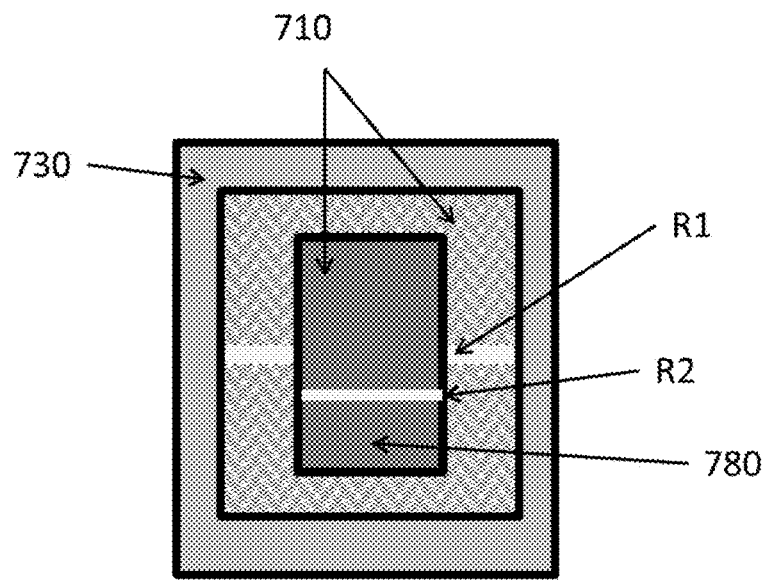
FIG. 7D-E schematically illustrates (FIG. 7D) and shows a picture (FIG. 7E) of an OEL obtained by the process of FIG. 7A-C.
Figure 7E:
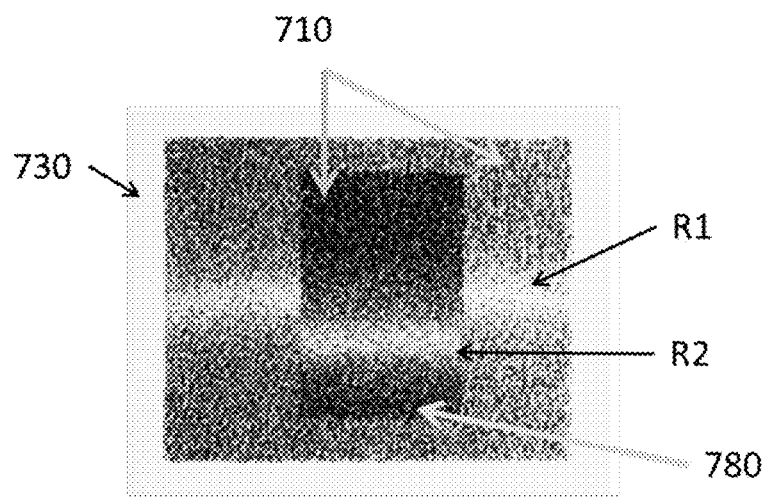

The resulting coated substrate carrying an OEL oriented according to a combination of two convex (negative) curvatures $R1^-$ and $R2^-$ is schematically represented in FIG. 7D. FIG. 7E shows a picture of the OEL prepared according to the process illustrated in FIG. 7A-C and described in the example E2.

Description of the Preparation of Example E3

A substrate comprising a photomask (880) in the shape of a rectangle (2.5×3.5 cm) (FIG. 8A-C) and made of an offset composition (see Table 2) containing 25 wt-% of C-black (Carbon Special Black 4A from Orion) was used. The photomask was printed as a solid print (about 20 cm×4 cm) on a printability tester from Prüfbau (offset composition amount was 2 g/m²).

A radiation (UV-Vis) curable coating composition comprising a plurality of non-spherical magnetic or magnetizable pigment particles described in Table 1 was applied on the substrate by silkscreen printing so as to obtain a coating layer having the shape of a rectangle (2×1.5 cm) in an area partially facing the photomask on the same side of the substrate, as illustrated in FIG. 8A.

The substrate comprising the photomask and the coating layer described herein was disposed on a magnetic-field-generating device (870) consisting of a NdFeB permanent magnetic bar (L×I×H=6×18×30 mm) used to orient the plurality of non-spherical magnetic or magnetizable pigments particles from the side of the substrate carrying the coating layer (810) so as follow a concave (positive, $R^+$) curvature. Partially simultaneously with the orientation of the pigment particles, the coating layer (810) was hardened by UV-irradiation for 0.05 sec with a UV-Vis irradiation source (840) (UV-LED-lamp from Phoseon, Type FireFlex 50×75 mm, 395 nm, 8 W/cm$^2$) disposed on the side of the substrate opposite to the side carrying the coating layer as illustrated in FIG. 8A, i.e. by irradiation through the substrate and the photomask. The resulting coated substrate carrying an OEL oriented according to a concave (positive, $R^+$) curvature is schematically represented in FIG. 8C.

The substrate was rotated in the plane of the substrate by 90°.

The magnetic-field-generating device (871) was disposed below the substrate (830) to orient the plurality of non-spherical magnetic or magnetizable pigment particles according to a convex (negative, $R^-$) curvature in the area wherein the coating layer (810) was not yet hardened due to the presence of the photomask, i.e. the area of the coating layer (810) facing the photomask (880). Partially simultaneously with the orientation of the pigment particles, the coating layer was hardened by exposing substrate to UV-irradiation for 0.2 sec with the UV-LED-lamp (870) disposed on the side of the substrate carrying the coating layer (810).

The resulting coated substrate carrying an OEL oriented according to a combination of a concave (positive) $R^+$ and a convex (negative) $R^-$ curvature is schematically represented in FIG. 8D-1. The same coated substrate is shown in FIG. 8D-2 after a rotation of 90° in the plane of the substrate.

UV-Absorbing Photomask Compositions

TABLE 2

Offset composition for the preparation of offset printed UV-absorbing photomasks

| | Ingredients | Composition wt-% |
|---|---|---|
| V1 | Varnish I | 40 |
| | Alkyd Resin Uralac AD85 | |
| | Varnish II | 52 |
| | (40 parts phenolic/alkyphenolic resins cooked in 40 parts tung oil and dissolved in 20 mineral oil (PKWF 6/9 af)) | |
| | Wax ULTRAPOLY ™ 930 E (Lawter) | 5.3 |
| | Antioxidant (tert-butyl hydroquinone) | 0.7 |
| | Drier (Co-bis(2-etylhexanoate) and Mn-bis(2-etylhexanoate) mixture) | 2 |
| | Total | 100 |
| | Absorbing material | Amounts indicated in Table 5 |

The offset composition of E3 was prepared by mixing at room temperature 75 parts of offset vehicle V1 (Table 2) and 25 parts of C-black (Carbon Special Black 4A from Orion). The resulting paste was ground on a SDY300 three roll mill in 3 passes (a first pass at a pressure of 6 bars, a second and a third pass at a pressure of 12 bars).

The offset composition of C1 was prepared by mixing at room temperature 1 part of the offset composition of E3 and 1 part of offset ink vehicle V1 (Table 2).

The offset composition of C2 was prepared by mixing at room temperature 1 part of the offset composition of C1 and 1 part of offset ink vehicle V1 (Table 2).

The so-obtained C1-C2 compositions were independently mixed in a SpeedMixer™ (DAC 150 SP CM31 from Hauschild Engineering) at a speed of 2500 rpm for 3 minutes at room temperature.

The offset compositions E3, C1 and C2 were independently printed as solid prints (about 20 cm×4 cm) on a printability tester from Prüfbau on a substrate to produce photomasks based on offset inks. The offset composition amount was 1 g/m$^2$ or 2 g/m$^2$ as indicated in Table 5.

The photomasks printed with the offset compositions were dried for seven days before applying the radiation (UV-vis) curable coating composition comprising non-spherical magnetic or magnetizable pigment particles as described hereabove.

TABLE 3

Solvent based silkscreen composition for the preparation of silkscreen printed UV-absorbing photomasks

| | Ingredients | Composition wt-% |
|---|---|---|
| V2 | NEOCRYL B-728 (DSM) | 21.4% |
| | 2-Butoxyethyl acetate | 50.8% |
| | Ethyl 3-ethoxy-propanoate | 23% |
| | TEGO ® AIREX 936 (Evonik Industries) | 2.4% |
| | BYK ® 053 (BYK) | 2.4% |
| | Total | 100 |
| | Absorbing material | Amounts indicated in Table 5 |

The solvent based silkscreen composition of E4 was prepared by mixing with a Dispermat® at room temperature 98.9 parts of silkscreen vehicle V2 (Table 3) and 1.1 parts of C-black (Carbon Special Black 4A from Orion).

The solvent based silkscreen composition of C3 was prepared by mixing with a Dispermat® at room temperature 1 part of the silkscreen composition of E4 and 3 parts of silkscreen vehicle V2 (Table 3).

The solvent based silkscreen composition of C4 was prepared by mixing with a Dispermat® at room temperature 1 part of the silkscreen composition of C3 and 1 part of silkscreen vehicle V2 (Table 3).

The solvent based silkscreen compositions E4, C3 and C4 were independently printed by screen printing using a T90 screen and dried for 10 minutes at 50° C. with a hair-drier.

The solvent based silkscreen composition of E5 was prepared by mixing with a Dispermat® at room temperature 60 parts of silkscreen vehicle V2 (Table 3) and 40 parts of TiO$_2$ (Tioxide TR52 from Huntsmann).

The solvent based silkscreen composition of C6 was prepared by mixing with a Dispermat® at room temperature 1 part of the silkscreen composition of E5 and 3 parts of silkscreen vehicle V2 (Table 3).

The solvent based silkscreen composition of C7 was prepared by mixing with a Dispermat® at room temperature 1 part of the silkscreen composition of C6 and 1 part of silkscreen vehicle V2 (Table 3).

The solvent based silkscreen compositions E5, C6 and C7 were independently printed by screen printing using a T90 screen and dried for 10 minutes at 50° C. with a hair-drier.

The solvent based silkscreen composition of E6 was prepared by mixing with a Dispermat® at room temperature 96 parts of silkscreen vehicle V2 (Table 3) and 4 parts of Tinuvin® Carboprotect® (from BASF).

The solvent based silkscreen composition of C8 was prepared by mixing with a Dispermat® at room temperature 1 part of the silkscreen composition of E6 and 3 parts of silkscreen vehicle V2 (Table 3).

The solvent based silkscreen composition of C9 was prepared by mixing with a Dispermat® at room temperature 1 part of the silkscreen composition of C8 and 1 part of silkscreen vehicle V2 (Table 3).

The solvent based silkscreen compositions E6, C8 and C9 were independently printed by screen printing using a T90 screen and dried for 10 minutes at 50° C. with a hair-drier.

TABLE 4

UV-curable silkscreen composition for the preparation of silkscreen printed UV-absorbing photomasks

| | Ingredients | Composition wt-% |
|---|---|---|
| V3 | Epoxyacrylate oligomer | 34.4% |
| | Trimethylolpropane triacrylate monomer | 23.8% |
| | Tripropyleneglycol diacrylate monomer | 24.5% |
| | Genorad 16 (Rahn) | 1.2% |
| | Aerosil 200 ® (Evonik) | 1.2% |
| | Irgacure ® 500 (BASF) | 7.4% |
| | Genocure ® EPD (Rahn) | 2.5% |

TABLE 4-continued

UV-curable silkscreen composition for the preparation of silkscreen printed UV-absorbing photomasks

| Ingredients | Composition wt-% |
|---|---|
| BYK ®-371 (BYK) | 2.5% |
| Tego Foamex N (Evonik) | 2.5% |
| Total | 100 |
| Absorbing material | Amounts indicated in Table |

The UV-curable silkscreen composition of E7 was prepared by mixing with a Dispermat® at room temperature 97 parts of silkscreen vehicle V3 (Table 4) and 3 parts of Tinuvin® CarboProtect® (UV-absorber from BASF).

The UV-curable silkscreen composition of O10 was prepared by mixing with a Dispermat® at room temperature 1 part of the silkscreen composition of E7 and 2 parts of silkscreen vehicle V3 (Table 4).

The UV-curable silkscreen composition of C11 was prepared by mixing with a Dispermat® at room temperature 1 part of the silkscreen composition of O10 and 1 part of silkscreen vehicle V3 (Table 4).

The UV-curable silkscreen compositions of E7, O10 and O11 were independently printed by screen printing using a T90 screen. The applied compositions were cured with a standard mercury UV lamp (one high pressure Hg-lamp 200 W and one Fe-doped-Hg-lamp 200 W) using a conveyor speed of 50 m/min.

TABLE 5

Printed UV-absorbing photomasks

| Example Number | Fig. Number (Picture) | Printing Ink Composition/ Printing Technic | Absorbing material | [Absorbing material] wt %[a] | Printed photo-mask deposit | $<T_{SM}>$ % | $D_M{}^{[g]}$ |
|---|---|---|---|---|---|---|---|
| E3 | 7A | Table 2/Offset | C-black[b] | 25 | 2 g/m² | 0.91 | 1.2 |
| C1 | 7B | Table 2/Offset | C-black[b] | 12.5 | 1 g/m² | 3.12 | 0.6 |
| C2 | 7C | Table 2/Offset | C-black[b] | 6.3 | 1 g/m² | 4.76 | 0.4 |
| E4 | 8A | Table 3/ SB Silkscreen | C-black[b] | 1.1 | T90[f] | 0.73 | 1.3 |
| C3 | 8B | Table 32/SB Silkscreen | C-black[b] | 0.28 | T90 | 2.97 | 0.6 |
| C4 | 8C | Table 3/ SB Silkscreen | C-black[b] | 0.14 | T90 | 5.26 | 0.4 |
| C5 | — | Table 2/Offset | TiO₂[c] | 40 | 2 g/m² | | nd[e] |
| E5 | 9A | Table 3/ SB Silkscreen | TiO₂[c] | 40 | T90 | 1.18 | 1.1 |
| C6 | 9B | Table 3/ SB Silkscreen | TiO₂[c] | 10 | T90 | 3.78 | 0.5 |
| C7 | 9C | Table 3/ SB Silkscreen | TiO₂[c] | 5 | T90 | 6.31 | 0.3 |
| E6 | 10A | Table 3/ SB Silkscreen | Tinuvin ® CarboProtect ®[d] | 4 | T90 | 0.52 | 1.4 |
| C8 | 10B | Table 3/ SB Silkscreen | Tinuvin ® CarboProtect ®[d] | 1 | T90 | 3.26 | 0.6 |
| C9 | 10C | Table 3/ SB Silkscreen | Tinuvin ® CarboProtect ®[d] | 0.5 | T90 | 5.17 | 0.4 |
| E7 | 11A | Table 3/UV-curable Silkscreen | Tinuvin ® CarboProtect ®[d] | 3 | T90 | 0.57 | 1.4 |

TABLE 5-continued

Printed UV-absorbing photomasks

| Example Number | Fig. Number (Picture) | Printing Ink Composition/ Printing Technic | Absorbing material | [Absorbing material] wt %[a] | Printed photo-mask deposit | $<T_{SM}>$ % | $D_M$[g] |
|---|---|---|---|---|---|---|---|
| C10 | 11B | Table 3/UV-curable Silkscreen | Tinuvin ® CarboProtect ®[d] | 1 | T90 | 2.62 | 0.7 |
| C11 | 11C | Table 3/UV-curable Silkscreen | Tinuvin ® CarboProtect ®[d] | 0.5 | T90 | 4.23 | 0.5 | wherein
[a] weight-% of the absorbing material in the compositions of Tables 3, 4 or 5;
[b] Carbon Special black 4 Å from Orion;
[c] TiO$_2$ Tioxide TR52 from Huntsmann;
[d] Tinuvin ® CarboProtect ® is a BASF UV-absorber based on a red-shifted benzotriazole compound for solvent based clear or semi-transparent coatings (useful for coatings over carbon fiber reinforced materials (CFRM);
[e] $D_M$ not determined as the photomask was not efficient despite the high concentration of the absorbing material;
[f] a T90 silkscreen screen corresponds to a wet deposit of about 25 g/m$^2$.
[g] $D_M$ was calculated as described herein with $<T_S>$ = 13% (value of the average transmission of the substrate).

Figure 9A:
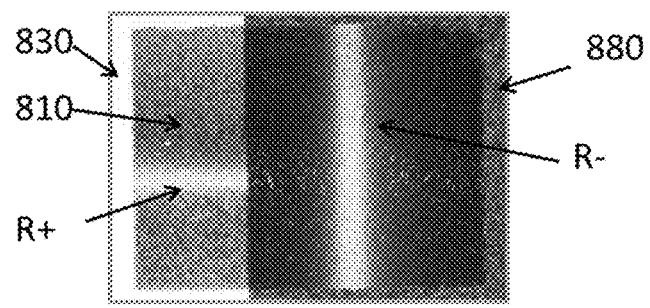
FIG. 9A-C show pictures of OEL's prepared according to the process illustrated in FIGS. 8A and 8B, wherein the photomask is an offset printed UV-absorbing photomask.
Figure 9B:
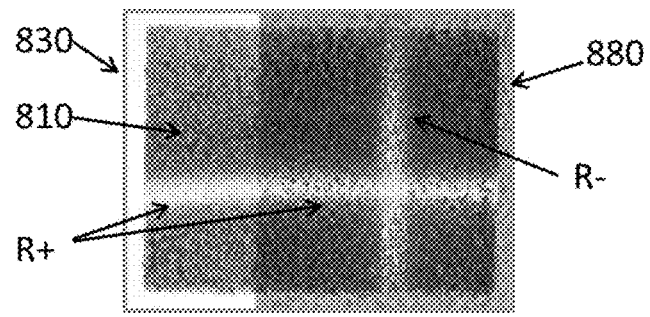
Figure 9C:
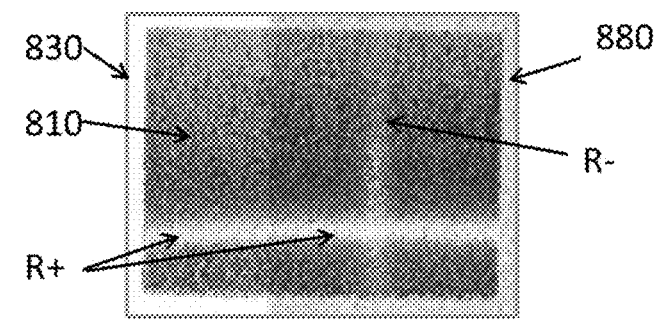
Figure 11A:
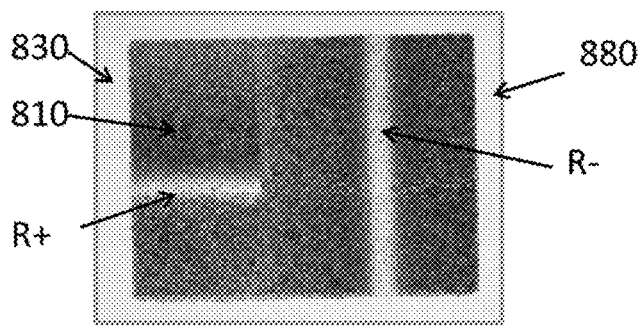
Figure 11B:
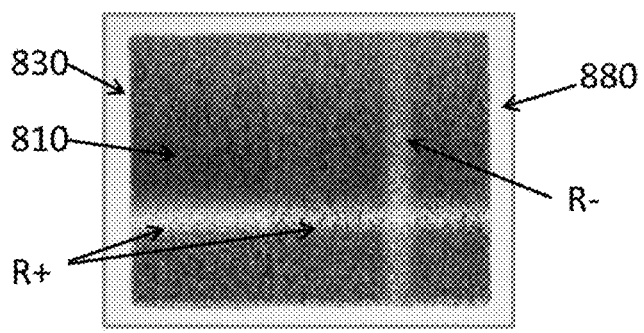
Figure 11C:
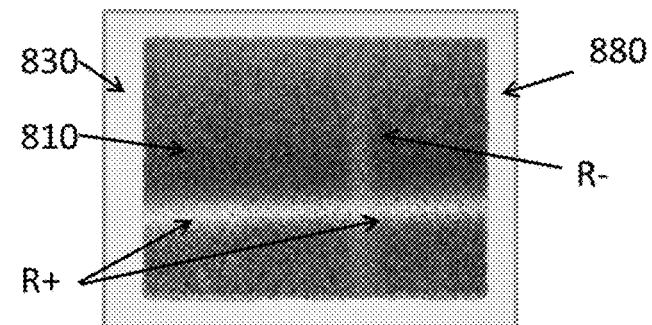
Figure 12A:
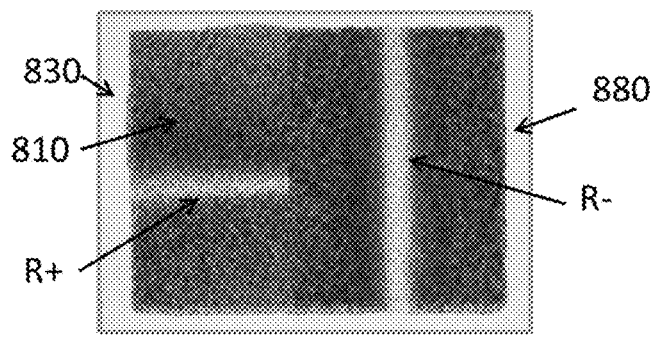
Figure 12B:
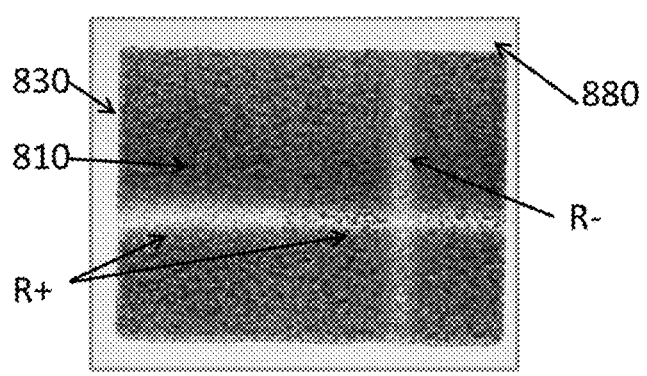
Figure 12C:
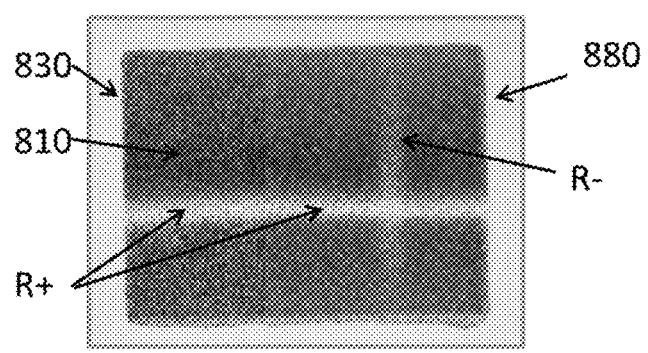

FIGS. 9A, 9B and 9C show pictures of OELs prepared according to the process illustrated in FIGS. 8A and 8B and described in the example E3 and the comparative examples C1 and C2 (see Table 5): the photomasks (880) comprised in the examples of FIG. 9A to 9C are made of similar compositions but differing in the concentration of the same absorbing material.

FIG. 9A shows an example of an OEL produced according to the process illustrated in FIGS. 8A and 8B. The process to produce the OEL shown in FIG. 9A (Example E3, Table 5) used a photomask (880) having a high optical density $D_M$ (1.2). In the area of the coating layer (810) facing (i.e. printed on top of) the photomask (880), the coating layer remained unhardened during the step of the process illustrated in FIG. 8A as a result of the absorption of the irradiation from the UV-Vis irradiation source (840) by the photomask. FIG. 9A shows an OEL comprising a pattern wherein the plurality of magnetic or magnetizable pigment particles follows a concave curvature (R+) that was obtained during the step illustrated in FIG. 8A in the area of the coating layer not facing the photomask (880), i.e. in the area of the coating layer that was hardened during the step illustrated in FIG. 8A. In the area of the coating layer facing (i.e. on top of) the photomask (880), the OEL comprises an area wherein the plurality of magnetic or magnetizable pigment particles follows a convex curvature (R−) as a result of the orientation of the magnetic or magnetizable pigment particles during the step illustrated in FIG. 8B.

FIG. 9B shows an example of an OEL produced according to the process illustrated in FIGS. 8A and 8B. The process to produce the OEL shown in FIG. 9B (Comparative Example C1, Table 5) used a photomask (880) having an intermediate optical density $D_M$ (0.6). In the area of the coating layer (810) facing (i.e. on top of) the photomask (880), the coating layer was partially hardened during the step of the process illustrated in FIG. 8A as a result of the partial absorption of the electromagnetic irradiation by the photomask (880). FIG. 9B shows an OEL comprising a pattern wherein the plurality of magnetic or magnetizable pigment particles follows a concave curvature (R+) that was obtained during the step illustrated in FIG. 8A in the area of the coating layer not facing the photomask (880), i.e. in the area of the coating layer that was hardened during the step illustrated in FIG. 8A. In the area of the coating layer facing (i.e. on top of) the photomask (880), the OEL comprises a pattern wherein a part of the plurality of magnetic or magnetizable pigment particles follows a convex curvature (R−) and wherein a part of the plurality of magnetic or magnetizable pigment particles follows a concave curvature (R+). The orientation of the magnetic or magnetizable pigment particles following a concave curvature (R+) was frozen during the step described in FIG. 8A as a result of the partial transmission of the electromagnetic radiation through the photomask; the orientation of the magnetic or non-magnetizable pigment particles following a convex curvature (R−) results from the orientation of the pigment particles during the step illustrated in FIG. 8B.

FIG. 9C shows an example of an OEL produced according to according to the process illustrated in FIGS. 8A and 8B. The process to produce the OEL shown in FIG. 9C (Comparative Example C2, Table 5) used a photomask (880) having a low optical density $D_M$ (0.4). In the area of the coating layer (810) facing (i.e. on top of) the photomask (880), the coating layer was completely or almost completely hardened during the step of the process illustrated in FIG. 8A as a result of the low absorption of the electromagnetic irradiation by the photomask. FIG. 9C shows an OEL comprising an area wherein the plurality of magnetic or magnetizable pigment particles follows a concave curvature (R+) obtained during the first step illustrated in FIG. 8A in the region of the coating layer not facing the photomask (880). In the region of the coating layer facing (i.e. on top of) the photomask, the OEL comprised an area wherein a part of the plurality of magnetic or magnetizable pigment particles follows a concave curvature (R+) and wherein few magnetic or magnetizable pigment particles follows a convex curvature (R+) as a result of the low absorption of the photomask during the step illustrated in FIG. 8A, and thus the hardening of the coating layer (810) and the freezing of the orientation of the pigment particles during the first step illustrated in FIG. 8A. In the event that the $D_M$ of the photomask of the example of FIG. 9C would be even lower, only an OEL comprising a plurality of magnetic of magnetizable pigment particles following a concave curvature (R+) would be visible in the area facing (i.e. on top of) the photomask.

FIGS. 10A, 11A, 12A and 13A show pictures of examples E4-E7 prepared similarly as described above with the compositions described in Tables-5. FIGS. 10B, 10C, 11B, 11C, 12B, 12C, 13B and 13C show pictures of the comparative examples C3-C4, C6-C7 and C8-C11 prepared as similarly described above with the compositions described in Tables 2-5.

The invention claimed is:

1. A process for producing an optical effect layer (OEL) on a substrate comprising a photomask, said OEL comprising a motif made of at least two areas, preferably at least two adjacent areas, made of a single hardened layer, said process comprising the steps of:
   a) applying on the substrate comprising the photomask a radiation curable coating composition comprising one or more photoinitiators and a plurality of magnetic or magnetizable pigment particles so as to form a coating layer, said coating layer being in a first state and said coating layer at least partially facing the photomask;
   b)
   b1) hardening one or more first substrate areas carrying the coating layer through the substrate, said hardening being performed by irradiation with a UV-Vis irradiation source to a second state so as to fix or freeze the magnetic or magnetizable pigment particles in their positions and orientations; and
   c)
   c1) exposing at least one or more second substrate areas carrying the coating layer which are in the first state due to the presence of the photomask of the substrate to a magnetic field of a magnetic-field-generating device thereby orienting the plurality of magnetic or magnetizable pigment particles so as to follow any magnetic or magnetizable pigment particles orientation pattern except a random orientation; and
   c2) simultaneously, partially simultaneously or subsequently hardening by irradiation with a UV-Vis irradiation source at least the one or more second substrate areas carrying the coating layer to the second state so as to fix or freeze the magnetic or magnetizable pigment particles in their adopted positions and orientations,
   wherein the photomask has an optical density $D_M$ equal to or higher than 1.0.

2. The process according to claim 1, wherein said the step b) comprises the steps of :
   b0) exposing one or more first substrate areas carrying the coating layer to a magnetic field of a first magnetic-field-generating device, thereby orienting the plurality of magnetic or magnetizable pigment particles so as to follow a magnetic or magnetizable pigment particles orientation pattern being any magnetic or magnetizable pigment particles orientation pattern except a random orientation, and
   b1) simultaneously or partially simultaneously or subsequently hardening through the substrate the coating layer, said hardening being performed by irradiation with a UV-Vis irradiation source to a second state so as to fix or freeze the magnetic or magnetizable pigment particles in their adopted positions and orientations,
   wherein the orientation pattern of step b0) is different from the orientation pattern of step c1).

3. The process according to claim 2, wherein said first magnetic-field generating device is located on a side of the substrate carrying the coating layer.

4. The process according to claim 3, wherein said first magnetic-field generating device orients the plurality of magnetic or magnetizable pigment particles so as to follow a concave curvature when viewed from the side carrying the coating layer.

5. The process according to claim 2, wherein step b1) is carried out partially simultaneously or simultaneously with step b0).

6. The process according to claim 1, wherein the step c1) is carried out with a second magnetic-field-generating device thereby orienting the plurality of magnetic or magnetizable pigment particles so as to follow a convex curvature when viewed from a side carrying the coating layer.

7. The process according to claim 2, wherein the magnetic or magnetizable pigment particles are non-spherical magnetic or magnetizable pigment particles.

8. The process according to claim 7, wherein the magnetic or magnetizable pigment particles are prolate or oblate ellipsoid-shaped, platelet-shaped or needle-shaped particles or a mixture of two or more thereof.

9. The process according to claim 7, wherein the magnetic or magnetizable pigment particles are platelet-shaped particles.

10. The process according to claim 1, wherein at least a part of the plurality of the magnetic or magnetizable pigment particles is constituted by magnetic thin-film interference pigments, magnetic cholesteric liquid crystal pigments, interference coated pigments including one or more magnetic materials and mixtures thereof.

11. The process according to claim 1, wherein the photomask is a printed UV-absorbing photomask made of a UV-absorbing photomask composition comprising a binder and one or more UV-absorbing materials.

12. The process according to claim 11, wherein the one or more UV absorbing materials are selected from the group consisting of dyes, organic pigments, inorganic pigments, optically variable pigments, fillers, UV-absorbers, mineral oxides nanoparticles and mixtures thereof.

13. The process according to claim 1, wherein the step c2) of hardening by irradiation with a UV-Vis irradiation source at least the one or more second substrate areas carrying the coating is carried out simultaneously or partially simultaneously with the step c1) of exposing at least one or more second substrate areas to the magnetic field of the magnetic-field-generating device.

14. The process according to claim 1, wherein the photomask has an optical density $D_M$ equal to or higher than 1.1.

15. The process according to claim 1, wherein the photomask has an optical density $D_M$ equal to or higher than 1.2.

16. An optical effect layer (OEL) prepared by the process recited in claim 1.

17. A security document comprising one or more optical effect layers (OEL) as recited in claim 16.

18. An optical effect layer (OEL), wherein the OEL is disposed on a substrate comprising a photomask, said OEL comprising a motif made of at least two areas made of a single hardened layer, the OEL comprising a radiation cured coating composition comprising a plurality of magnetic or magnetizable pigment particles fixed or frozen in the coating composition by radiation curing so as to form a coating layer, said coating layer at least partly overlapping with the photomask to provide a masked area and an unmasked area thereof;
   wherein the magnetic or magnetizable pigment particles of the masked area of the coating layer are oriented so as to follow any magnetic or magnetizable pigment particles orientation pattern except a random orientation; and
   wherein the magnetic or magnetizable pigment particles of the unmasked area of the coating layer follow a random pattern or are oriented so as to follow a different orientation pattern than that of the magnetic or magnetizable pigment particles of the masked area to provide visually distinct optical impressions as determinable by the human eye.

* * * * *